United States Patent
Aime et al.

(10) Patent No.: US 8,611,981 B2
(45) Date of Patent: Dec. 17, 2013

(54) MRI-CEST DIAGNOSTIC TECHNIQUE BASED ON NON-PUNCTUAL ANALYSIS

(75) Inventors: Silvio Aime, Garignano (IT); Daniela Delli Castelli, Bibiana (IT); Dario Livio Longo, Manta (IT); Joseph Stancanello, Mineo (IT); Enzo Terreno, Bibiana (IT); Fulvio Uggeri, Codogno (IT)

(73) Assignee: Bracco Imaging S.p.A., Milan (IT)

( * ) Notice: Subject to any disclaimer, the term of this patent is extended or adjusted under 35 U.S.C. 154(b) by 276 days.

(21) Appl. No.: 13/060,397

(22) PCT Filed: Aug. 18, 2009

(86) PCT No.: PCT/EP2009/060680
§ 371 (c)(1),
(2), (4) Date: Feb. 23, 2011

(87) PCT Pub. No.: WO2010/023132
PCT Pub. Date: Mar. 4, 2010

(65) Prior Publication Data
US 2011/0152671 A1    Jun. 23, 2011

Related U.S. Application Data

(60) Provisional application No. 61/190,163, filed on Aug. 26, 2008.

(51) Int. Cl.
*A61B 5/05* (2006.01)
*G01V 3/00* (2006.01)

(52) U.S. Cl.
USPC ............ 600/420; 600/410; 324/307; 324/309

(58) Field of Classification Search
USPC ................... 600/410, 420; 324/309
See application file for complete search history.

(56) References Cited

U.S. PATENT DOCUMENTS

| | | | | |
|---|---|---|---|---|
| 7,610,077 | B2 * | 10/2009 | Dixon et al. | 600/420 |
| 2008/0200799 | A1 * | 8/2008 | Willard et al. | 600/420 |
| 2010/0026297 | A1 * | 2/2010 | Sun et al. | 324/309 |
| 2010/0286502 | A1 * | 11/2010 | Van Zijl et al. | 600/410 |

FOREIGN PATENT DOCUMENTS

| | | |
|---|---|---|
| WO | 0066180 | 11/2000 |
| WO | 03049604 | 6/2003 |
| WO | 2007014004 | 2/2007 |

OTHER PUBLICATIONS

J. Stancanelloa, E. Terreno, D. Delli Castelli, C. Cabella, F. Uggeri and S. Aime, "Development and validation of a smoothing-splines-based correction method for improving the analysis of CEST-MR images", Contrast Media Mol. Imaging 2008, 3 pp. 136-149, XP-002557837.

George C. Levy, Deborah J. Kerwood, & Muppirala Ravikumar, "Data Processing", Encyclopedia of Nuclear Magnetic resonance, 1996, John Wiley & Sons, pp. 1548-1558, XP-002557838.

Hoch JC, "NMR Data Processing" 1996, pp. 175-180, XP-002557839.

V. Guivel-Scharen, T. Sinnwell, S. D. Wolff, and R. S. Balaban, "Detection of Proton Chemical Exchange between Metabolites and Water in Biological Tissues", Journal of Magnetic Resonance 133, 36-45 (1998).

Jinyuan Zhou, Peter C.M. van Zijl, "Chemical exchange saturation transfer imaging and spectroscopy", Progress in Nuclear Magnetic Resonance Spectroscopy 48 (2006) 109-136.

Enzo Terreno, Joseph Stancanello, Dario Longo, Daniela Delli Castelli, Luciano Milone, Honorius M. H. F. Sanders, Maarten B. Kok, Fulvio Uggeri and Silvio Aime, "Methods for an improved detection of the MRI-CEST effect", Contrast Media and Molecular Imaging 2009, 4, pp. 237-247, XP-002557836.

Wen Ling, Uzi Eliav, Gil Navon, Alexej Jerschow, "Chemical exchange saturation transfer by intermolecular double-quantum coherence", Journal of Magnetic Resonance 194 (2008), pp. 29-32.

International Search Report for International Application Serial No. PCT/EP2009/060680, European Patent Office, Nov. 27, 2009, pp. 6.

Enzo Terreno, Claudia Cabella, Carla Carrera, Daniela Delli Castelli, Roberta Mazzon, Simona Rollet, Joseph Stancanello, Massimo Visigalli, and Silvio Aime, "From Spherical to Osmotically Shrunken Paramagnetic Liposomes: An Improved Generation of LIPOCEST MRI Agents with Highly Shifted Water Protons", Angew. Chem. Int. Ed. 2007, 46, pp. 966-968.

Enzo Terreno, Daniela Delli Castelli, Luciano Milone, Simona Rollet, Joseph Stancanello, Elisabetta Violante and Silvio Aime, "First ex-vivo MRI co-localization of two LIPOCEST agents", Contrast Media Molecular Imaging 2008,3, pp. 38-43.

K. M. Ward, A. H. Aletras, and R. S. Balaban, "A New Class of Contrast Agents for MRI Based on Proton Chemical Exchange Dependent Saturation Transfer (CEST)", Journal of Magnetic Resonance 143, (2000), pp. 79-87.

Donald E. Woessner, Shanrong Zhang, Matthew E. Merritt, and A. Dean Sherry, "Numerical Solution of the Bloch Equations Provides Insights Into the Optimum Design of PARACEST Agents for MRI", Magnetic Resonance in Medicine 53:790-799 (2005).

\* cited by examiner

*Primary Examiner* — Long V. Le
*Assistant Examiner* — Helene Bor
(74) *Attorney, Agent, or Firm* — Bryan A. Santarelli; Graybeal Jackson LLP

(57) ABSTRACT

An embodiment in the MRI-CEST field is proposed for analyzing a body-part, which includes a CEST agent providing a magnetization transfer with a bulk substrate of the body-part. A corresponding diagnostic system includes input means for providing an input map including a plurality of input elements each one for a corresponding location of the body-part; each input element is indicative of a spectrum of a magnetic response of the location, which spectrum includes the magnetic response at an agent frequency of resonance of the contrast agent (with the agent frequency that is at an agent offset of frequency from a bulk frequency of resonance of the bulk substance), and at a reference frequency at the opposite of the agent offset from the bulk frequency. The system further includes calculation means for calculating an agent value and a reference value for each one of a set of selected locations; the agent value is calculated according to the magnetic responses of the selected location in a non-punctual agent range of frequencies including the agent frequency, and the reference value is calculated according to the magnetic responses of the selected location in a non-punctual reference range of frequencies including the reference frequency (with the reference range that is symmetric to the agent range with respect to the bulk frequency). Comparison means is then provided for calculating a parametric value for each selected location; the parametric value is calculated according to a comparison between the agent value and the reference value of the selected location.

19 Claims, 22 Drawing Sheets

MRI-CEST DIAGNOSTIC TECHNIQUE BASED ON NON-PUNCTUAL ANALYSIS

PRIORITY CLAIM

The present application is a national phase application filed pursuant to 35 USC §371 of International Patent Application Serial No. PCT/EP2009/060680, filed Aug. 18, 2009; which further claims the benefit of U.S. Provisional Patent Application Ser. No. 61/190,163 filed Aug. 26, 2008; all of the foregoing applications are incorporated herein by reference in their entireties.

TECHNICAL FIELD

One or more embodiments relate to the field of medical equipments. More specifically, one or more embodiments relate to the field of Magnetic Resonance Imaging (MRI) of the Chemical Exchange Saturation Transfer (CEST) type.

BACKGROUND

MRI is a well-established technique (in the field of equipments for medical applications), which allows analyzing a body-part of a patient in a substantially non-invasive manner. In general terms, the MRI is based on the application of a high magnetic field to the body-part. As the body-part reacts to the magnetic field in a different way according to its characteristics, by measuring a magnetic response of the body-part it is possible to derive morphological and/or physiological information about it (for example, for the display of a corresponding image).

For this purpose, in a standard MRI technique a magnetic pulse is applied to the body-part so as to alter its magnetization. The magnetization of the body-part then returns to its equilibrium condition with a different relaxation time according to the corresponding characteristics. Therefore, the measure of the magnetization of the body-part while it is returning to the equilibrium condition may be used to represent its characteristics. A contrast agent altering the relaxation time of a specific target region (such as a gadolinium complex) may also be administered to the patient so as to highlight it.

The MRI-CEST technique, instead, exploits a CEST contrast agent (for example, a paramagnetic lanthanide complex) that is capable of transferring its saturated magnetization to the water by chemical exchange. In this case, the measure of this saturation transfer may be used to represent a target region with the CEST agent. For this purpose, a saturation pulse at a resonance frequency of the CEST agent is applied to the body-part, so as to saturate the CEST agent by canceling its magnetization; the saturation transfer then causes a corresponding reduction of the magnetization of the water. Therefore, the saturation transfer may be measured by comparing the magnetization of the body-part at the resonance frequency of the LEST agent with a reference value representing the magnetization of the body-part alone (i.e., without the CEST agent); since the magnetic response of the body-part alone is substantially symmetric around a resonance frequency of the water, the reference value may be defined by the magnetization of the body-part at a reference frequency opposite the resonance frequency of the CEST agent with respect to the resonance frequency of the water. For example, the MRI-CEST technique is described in "Ward K M, Aletras A H, Balaban R S, "A new class of contrast agents for MRI based on proton chemical exchange dependent saturation transfer (CEST)," J Magn Reson. 2000; 143(1):79-87" (the entire disclosure of which is herein incorporated by reference).

The MRI-CEST technique allows enabling the CEST agent selectively (by means of the saturation pulse of the CEST agent at the corresponding resonance frequency); therefore, it may also be possible to obtain images representing more CEST agents in the same body-part. Moreover, the desired information is obtained directly from the magnetic response of the body-part—without the need of comparing the acquired image with a background image without any contrast agent as in the (standard) MRI technique.

Several studies about possible applications of the MRI-CEST technique have been reported; for example, the MRI-CEST technique has been proposed for pH measurements, cell labeling, imaging of diagnostic markers like glucose, lactate and zinc, visualization of enzyme activity, and monitoring of gene expression.

Nevertheless, the MRI-CEST technique still suffers from some drawbacks that make its practical exploitation challenging. Particularly, errors may occur in the measurement of the saturation transfer because of spillover effects (causing an unwanted magnetization diffusion) when the resonance frequency of the CEST agent is too close to the resonance frequency of the water. Another source of errors is any asymmetry in the magnetic response of the body-part (caused by natural magnetization transfers in the body-part). Moreover, further errors may arise from differences of an actual offset of the resonance frequency of the CEST agent from the resonance frequency of the water with respect to its theoretical value (caused by heterogeneities of the body-part). Additional errors may be due to non-optimal shimming and tuning, signal damping, inhomogeneity of the magnetic field, and shifts and deformations due to involuntary motions of the body-part.

Therefore, the MRI-CEST techniques known in the art provide a relatively poor Contrast-to-Noise Ratio (CNR) for the detection of the target regions. All of the above limits the accuracy of the MRI-CEST technique (with possible false detections of the target regions) and its sensitivity (resulting in missing detections of the target regions).

SUMMARY

In their general terms, one or more embodiment are based on the idea of applying a non-punctual analysis:

Particularly, an embodiment proposes an MRI-CEST diagnostic system for analyzing a body-part, which includes a CEST agent providing a magnetization transfer (for example, a saturation transfer) with a bulk substrate of the body-part. The system includes input means for providing an input map including a plurality of input elements each one for a corresponding location of the body-part; each input element is indicative of a spectrum of a magnetic response of the location, which spectrum includes the magnetic response at an agent frequency of resonance of the contrast agent (with the agent frequency that is at an agent offset of frequency from a bulk frequency of resonance of the bulk substance), and at a reference frequency at the opposite of the agent offset from the bulk frequency. The system further includes calculation means for calculating an agent value (for example, indicative of a bulk magnetization upon saturation of the CEST agent) and a reference value (for example, indicative of the bulk magnetization without saturating the CEST agent) for each one of a set of selected locations; the agent value is calculated according to the magnetic responses of the selected location in a non-punctual agent range of frequencies including the agent frequency, and the reference value is calculated according to the magnetic responses of the selected location in a non-punctual reference range of frequencies including the reference frequency (with the reference range that is symmetric to the agent range with respect to the bulk frequency). Comparison means is then provided for calculating a parametric value for each selected location; the parametric value is calculated according to a comparison between the agent value and the reference value of the selected location.

In an embodiment, the agent range and the reference range extend around the bulk frequency from a first agent limit to a second agent limit being different from the agent frequency, and from a first reference limit to a second reference limit being different from the reference frequency, respectively.

In an embodiment, the first agent limit and the first reference limit consist of the bulk frequency.

In an embodiment, the agent range is centered around the agent frequency and the reference range is centered around the reference frequency.

In an embodiment, the calculation means includes means for calculating the agent value according to an integral of the magnetic responses Of the selected location in the agent range, and for calculating the reference value according to an integral of the magnetic responses of the selected location in the reference range.

In an embodiment, the calculation means includes means for calculating the agent value according to a complement of an integral of the magnetic responses of the selected location in the agent range, and for calculating the reference value according to a complement of an integral of the magnetic responses of the selected location in the reference range.

In an embodiment, the combination means includes means for calculating the parametric value according to an intermediate value; the intermediate value is based on a first ratio between the reference value and the agent value.

In an embodiment, the combination means includes means for setting the parametric value to one minus the intermediate value.

In an embodiment, the combination means includes means for setting the intermediate value to the first ratio.

In an embodiment, the combination means includes means for calculating the intermediate value according to a combination of the first ratio with a second ratio between the magnetic response of the selected location at the reference frequency and the magnetic response of the selected location at the agent frequency.

In an embodiment, the combination means includes means for setting the intermediate value to a product between the first ratio and the second ratio.

In an embodiment, the input means includes estimation means for estimating a central frequency for each selected location (with the central frequency that provides a minimum value of the magnetic response of the selected location), and correction means for setting the bulk frequency of each selected location to the central frequency of the selected location.

In an embodiment, each input element includes a sample array of a plurality of magnetic responses of the corresponding location in a working range of frequencies including the bulk frequency, the agent frequency and the reference frequency; the estimation means then includes means for associating a model function with the sample array of each selected location, and means for setting the central frequency for each selected location to a minimum of the corresponding model function.

In an embodiment, the system further includes means for creating a parametric image by assigning the corresponding parametric value to each selected location, and means for displaying the parametric image.

An embodiment proposes a corresponding post-processing method. Particularly, there is proposed an embodiment of a method for processing information to be used for analyzing a body-part, which includes a CEST agent providing a magnetization transfer with a bulk substrate of the body-part. The method starts with the step of providing an input map including a plurality of input elements each one for a corresponding location of the body-part; each input element is indicative of a spectrum of a magnetic response of the location, which spectrum includes the magnetic response at an agent frequency of resonance of the contrast agent (with the agent frequency that is at an agent offset of frequency from a bulk frequency of resonance of the bulk substance), and at a reference frequency at the opposite of the agent offset from the bulk frequency. The method continues by calculating an agent value and a reference value for each one of a set of selected locations; the agent value is calculated according to the magnetic responses of the selected location in a non-punctual agent range of frequencies including the agent frequency, and the reference value is calculated according to the magnetic responses of the selected location in a non-punctual reference range of frequencies including the reference frequency (with the reference range that is symmetric to the agent range with respect to the bulk frequency). A parametric value is then calculated for each selected location; the parametric value is calculated according to a comparison between the agent value and the reference value of the selected location.

An embodiment proposes a corresponding diagnostic method. Particularly, there is proposed an embodiment of a diagnostic method for analyzing a body-part, which includes a CEST agent providing a magnetization transfer with a bulk substrate of the body-part. The method starts with the step of providing an input map including a plurality of input elements each one for a corresponding location of the body-part; each input element is indicative of a spectrum of a magnetic response of the location, which spectrum includes the magnetic response at an agent frequency of resonance of the contrast agent (with the agent frequency that is at an agent offset of frequency from a bulk frequency of resonance of the bulk substance), and at a reference frequency at the opposite of the agent offset from the bulk frequency. The method continues by calculating an agent value and a reference value for each one of a set of selected locations; the agent value is calculated according to the magnetic responses of the selected location in a non-punctual agent range of frequencies including the agent frequency, and the reference value is calculated according to the magnetic responses of the selected location in a non-punctual reference range of frequencies including the reference frequency (with the reference range that is symmetric to the agent range with respect to the bulk frequency). A parametric value is then calculated for each selected location; the parametric value is calculated according to a comparison between the agent value and the reference value of the selected location.

In an embodiment, the step of providing an input map includes administering the CEST agent to the body-part, and acquiring the input map from the body-part.

In an embodiment, the diagnostic method further includes the step of inferring characteristics of each selected location according to the corresponding parametric value.

The same additional features described above with reference to a system apply mutatis mutandi to a post-processing method and to a diagnostic method (either alone or in combination with each other).

An embodiment proposes a corresponding computer program; particularly, an embodiment of a computer program includes code means for causing a data processing system to perform the steps of the post-processing method when the computer program is executed on the system.

An embodiment proposes a corresponding computer program product. Particularly, an embodiment of a product includes a computer-usable medium embodying a computer program; the computer program, when it is executed on a data processing system, causes the system to perform the same post-processing method.

BRIEF DESCRIPTION OF THE DRAWINGS

One or more embodiments, as well as features and the advantages thereof, will be best understood with reference to the following detailed description, given purely by way of a non-restrictive indication, to be read in conjunction with the accompanying drawings (wherein corresponding elements are denoted with equal or similar references and their explanation is not repeated for the sake of brevity, and the name of each signal or parameter is generally used to denote both its type and its value for the sake of simplicity). Particularly.

DETAILED DESCRIPTION

Figure 1:
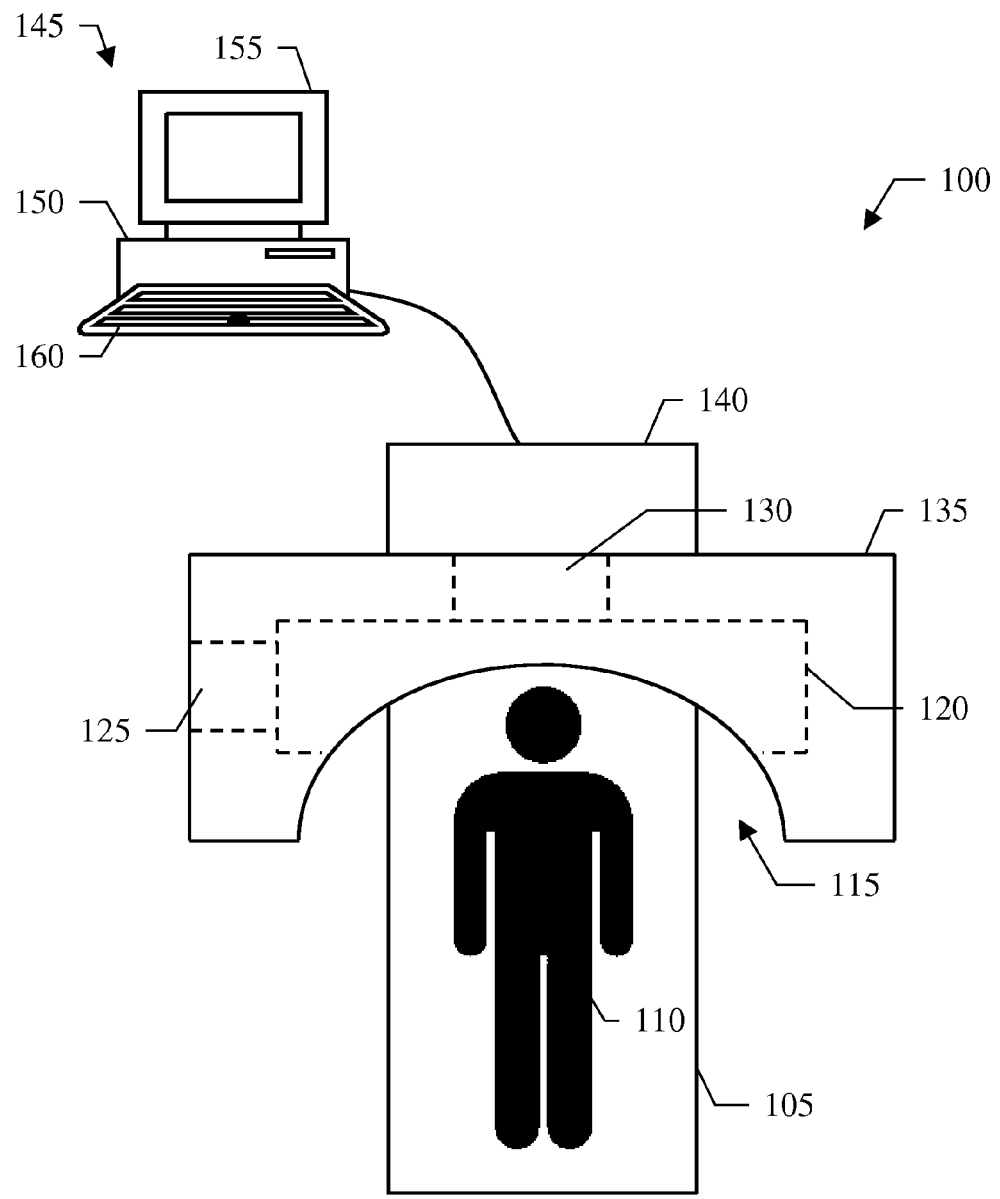
FIG. 1 is a pictorial representation of a scanner in which an embodiment is applicable.

With reference in particular to FIG. 1, there is illustrated an MRI scanner 100 in which an embodiment is applicable. The scanner 100 includes a table 105 for laying down a patient 110 under analysis. The table 105 may slide inside a tunnel 115. The tunnel 115 houses a permanent magnet 120, which generates a very high stationary magnetic field Bo (for example, of the order of 1-9T). Multiple sets of gradient coils 125 (typically, three sets of gradient coils 125 each one for a different direction) are coupled with the magnet 120 for adjusting the magnetic field Bo. The tunnel 115 further houses a Radio Frequency (RF) coil 130, which applies magnetic pulses B1 to a specific body-part of the patient 110 to be analyzed, and receives RF magnetic response signals that are returned by the same body-part; the RF coil 130 may have different structures (for example, a surface coil, a saddle coil, a Helmholts coil, and so on) according to the kind of body-part for which the scanner 110 is designed (for example, shoulders, knees, spines, heads, and so on). The tunnel 115 is provided with a magnetic shield 135, which surrounds the magnet 120, the gradient coil 125 and the RF coil 130; the shield 135 prevents the magnetic fields generated inside the tunnel 115 to radiate outside the scanner 100, and at the same time it protects the inside of the tunnel 115 from external magnetic interferences.

A controller 140 includes all the components that are required to drive the gradient coil 125 and the RF coil 130 (for example, an RF transmitter, an output amplifier, and the like); the controller 140 also includes all the components that are required to acquire the response signals from the body-part (for example, an input amplifier, an Analog-To-Digital Converter, or ADC, and the like). Moreover, the controller 140 drives a motor (not shown in the figure) that is used to move the table 105 to and from the tunnel 115.

The scanner 100 is managed by means of a computer 145 (for example, a Personal Computer, or PC), which is coupled with the controller 140. The computer 145 has a central unit 150 that houses all its main components (for example, a microprocessor, a working memory, a hard-disk, a drive for removable discs, and the like), which are used to control the scanner 100 and to post-process the acquired response signals. A monitor 155 displays images relating to the body-part under analysis. Operation of the scanner 100 is controlled by means of a keyboard 160; preferably, the keyboard 160 is provided with a trackball that is used to manipulate the position of a pointer (not shown in the figure) on a screen of the monitor 155.

In operation, the patient 110 lays down on the table 105 (extracted from the tunnel 115). The table 105 is then made to slide inside the tunnel 115, until the body-part of the patient 105 to be analyzed reaches a proper position within it. The magnetic field Bo (generated by the magnet 120 and the gradient coil 125) magnetizes a bulk substance of the body-part (i.e., water). More specifically, the two protons of each water molecule have a net magnetic spin that aligns with the magnetic field Bo. The spins may orient either in the same direction as or against the direction of the magnetic field Bo. At an equilibrium condition, the number of spins in the same direction of the magnetic field Bo (in a low-energy state) slightly exceeds the number of the spins against it (in a high-energy state). On a macroscopic level, this generates a magnetization of each location of the body-part in the same direction of the magnetic field Bo (longitudinal z-axis), which depends on its physical and/or chemical properties being due to different characteristics thereof—for example, the type of tissue, its healthy or pathologic condition, and the like (even if the differences are so small that they may not be used in practice to represent them).

The scanner 100 may be used, in a standard MRI technique, to image the body-part. For this purpose, the RF coil 130 applies a magnetic pulse at a resonance (or Larmor) frequency of the water to the body-part; the water (resonance) frequency depends on the magnetic field Bo, so that it may be possible to selected a specific Field of View (FOV) of the body-part to be imaged (for example, a slice thereof), by controlling the magnetic field Bo (through the gradient coil 125) to provide the water frequency at a desired value only in the selected slice. In this way, the spins absorb energy that moves them from the low-energy state to the high-energy state. The spins then return to their equilibrium condition; in this phase, a transverse component of the magnetization of each location (in an xy-plane perpendicular to the z-axis) changes accordingly until returning to zero. However, the time required by each location to return to the equilibrium condition (known as relaxation) strongly depends on its characteristics. Therefore, by measuring the transverse component of the magnetization of each location shortly after the application of the magnetic pulse (with a delay lower than any possible relaxation time), there will be obtained a value that may be used to display the location.

The same scanner 100 is also used, in the MRI-CEST technique, to characterize the body-part. In this case, a CEST agent (for a corresponding target region) is administered to the patient. The CEST agent includes a pool (or more) of mobile protons that are capable of providing a chemical exchange with the protons of the surrounding water. The CEST agent may be formed of either endogenous or exogenous molecules. Examples of endogenous CEST agents are metabolites, amide protons, and the like. Examples of exogenous CEST agents are DIAmagnetic CEST (DIACEST) agents (such as poly(U) and dendrimer-poly(rU)), PARAmagnetic CEST (PARACEST) agents (such as lanthanide complexes), and LIPOsome-based CEST (LIPOCEST) agents (such as liposome loaded with paramagnetic lanthanide complexes).

Therefore, when the equilibrium condition of the CEST agent is altered (by moving some spins from the low-energy state to the high-energy state), this chemical exchange causes a magnetization transfer from the CEST agent to the water—and particularly, a saturation transfer when the CEST agent has been saturated by completely canceling its magnetization. Indeed, the chemical exchange increases the number of spins of the CEST agent in the low-energy state at the expenses of the spins of the water in the high-energy state; at the same time, the chemical exchange increases the number of spins of the water in the high-energy state at the expenses of the spins of the CEST agent in the low-energy state. As a whole, this causes a decrease of the spins of the water at the low-energy with a corresponding increase of its spins at the high-energy state Therefore, if a rate of the saturation transfer (tending to move the spins of the water from the low-energy state to the high-energy state) is faster then the relaxation time of both the CEST agent and the water (tending to return their spins to the corresponding equilibrium condition), it is possible to observe a reduction of the magnetization of the water (shortly after the saturation of the CEST agent). Therefore, by measuring the saturation transfer of each location there will be obtained a parameter indicative of the effect of the CEST agent on the location, and then of its characteristics.

For this purpose, a pre-saturation magnetic pulse is applied to the body-part (by means of the RF coil 130) at a resonance frequency of the CEST agent (with a length sufficient to saturate the CEST agent). A Z-spectrum of the magnetization of each location of the body-part is then acquired, by applying a series of magnetic pulses in a working frequency range symmetric around the water frequency—including the CEST (resonance) frequency—and then measuring the corresponding magnetization (as described above).

Figure 2A:
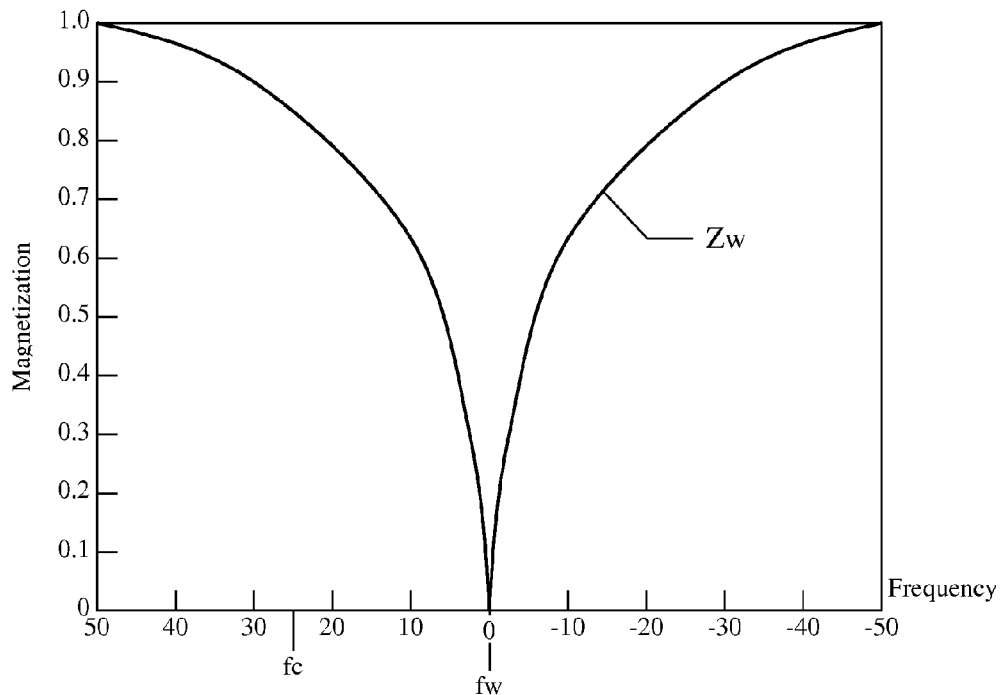
FIGS. 2A-2B show illustrative examples of Z-spectra that may be provided by the scanner.

An illustrative example of Z-spectrum of a generic location without any CEST effect is represented in FIG. 2A with a graph, which plots the magnetization of the location on the ordinate-axis against the frequency of the magnetic pulses on the abscissa-axis; the corresponding points define a curve Zw that represents the Z-spectrum. The magnetization is expressed in normalized intensity values (from 0 to 1) with respect to a maximum value thereof—normally at the ends of the working frequency range. The frequency is expressed as an offset from the water frequency fw (taken as an origin equal to 0) in parts-per-million (ppm) of the water frequency fw; in the example at issue, the working frequency range spans around the water frequency fw (for example, of the order of 100-400 MHz according to the magnetic field Bo, such as fw=300 MHz at 7 T) from a frequency offset of −50 ppm to a frequency offset of +50 ppm (i.e., from 300 MHz-15 KHz to 300 MHz+15 KHz). Theoretically, the Z-spectrum Zw is symmetric with respect to the water frequency fw; particularly, the magnetization decreases from the value 1 (at the frequency offset −50 ppm) to a (null) bulk peak at the water frequency fw, and then increases in a specular way towards the value 1 again (at the frequency offset +50 ppm).

Figure 2B:
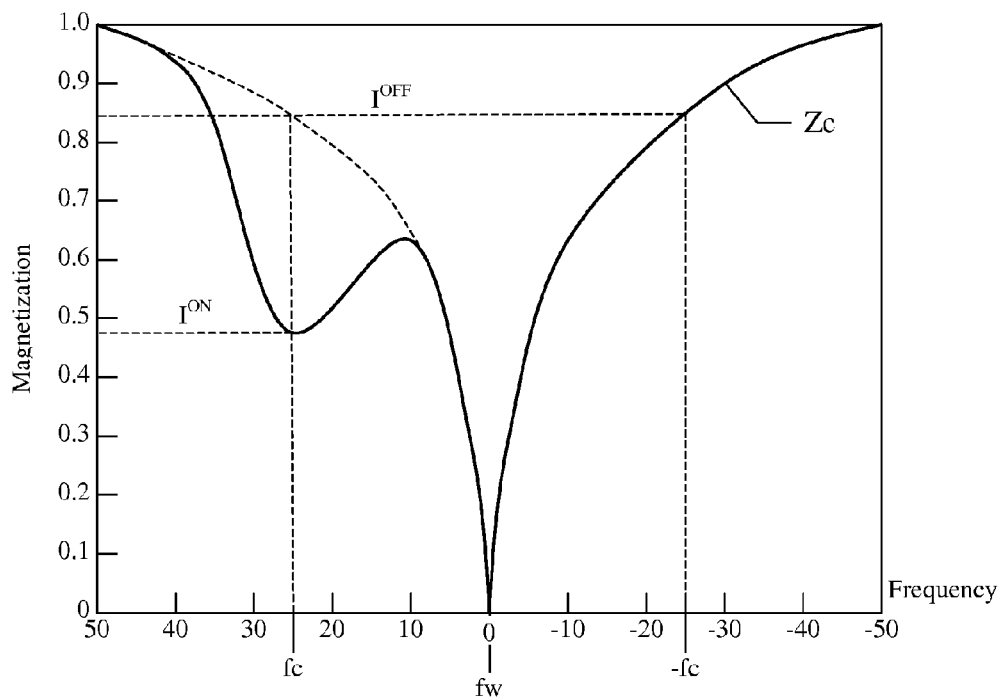

Moving to FIG. 2B, an illustrative example of Z-spectrum of the same location subject to the CEST effect is instead represented by a corresponding curve Zc. In this case, the saturation transfer from the CEST agent to the water reduces the magnetization of the location when the CEST agent is saturated. Therefore, the Z-spectrum Zc now features a further CEST peak, less deep than the bulk peak, at the CEST frequency fc (at a corresponding CEST offset from the water frequency fw). The saturation transfer may then be measured by comparing a CEST magnetization of the location possibly including the CEST agent at the CEST frequency fc (denoted with $I^{ON}$) with a reference magnetization representing the magnetization of the location without any CEST agent (denoted with $I^{OFF}$); since the Z-spectrum without the CEST effect is symmetric around the water frequency fw (as shown in FIG. 2A), the reference magnetization $I^{OFF}$ is given by the magnetization at a controlateral reference frequency −fc (at an opposite offset from the water frequency fw with respect to the CEST frequency fc).

In the standard MRI-CEST techniques known in the art, the saturation transfer is classically measured by a parameter referred to as Saturation Transfer (ST), which is calculated by the following formula:

$$ST = \left(1 - \frac{I^{ON}}{I^{OFF}}\right) = \left(\frac{I^{OFF} - I^{ON}}{I^{OFF}}\right).$$

Therefore, the saturation transfer ST ranges from 0 when no CEST effect is registered (since $I^{OFF}=I^{ON}$) to 1 when the CEST effect is maximum, so as to completely saturate the water (since $I^{ON}=0$).

In an embodiment, as described in detail in the following, the comparison for measuring the saturation transfer is instead performed between two composite values based on multiple values of the magnetization in corresponding frequency ranges opposite to each other with respect to the water frequency fw (including the CEST frequency fc and the reference frequency −fc, respectively).

In this way, the measuring of the saturation transfer is now based on non-punctual portions of the Z-spectrum (instead of the mere punctual values of the solutions known in the art). This allows compensating (at least in part) errors that may occur in the measurement of the saturation transfer because of spillover effects (when the CEST frequency fc is close to the water frequency fw), asymmetries of the Z-spectrum with respect to the water frequency fw, and differences of the actual CEST offset with respect to its theoretical value (in addition to non-optimal shimming and tuning, signal damping, inhomogeneity of the magnetic fields B0 and B1, and shifts and deformations due to involuntary motions of the body-part). Therefore, these advantages may be particularly evident when the Z-spectrum exhibits a relatively broad CEST peak.

This strongly increases the contrast-to-noise ratio (CNR) of the obtained results (facilitating the detection and then the localization of the target regions, wherein the CEST agent is present). All of the above increases the accuracy of the MRI-CEST technique (strongly reducing any false detection of the target regions) and its sensitivity (strongly reducing any missing detection of the target regions).

Particularly, an embodiment facilitates the task of a physician, by providing intermediate, results that may help him/her in performing a diagnosis of the body-part (even though the diagnosis for curative purposes stricto senso is always made by the physician himself/herself).

Exemplary applications of different embodiments are shown in FIG. 3A-3D.

Figure 3A:
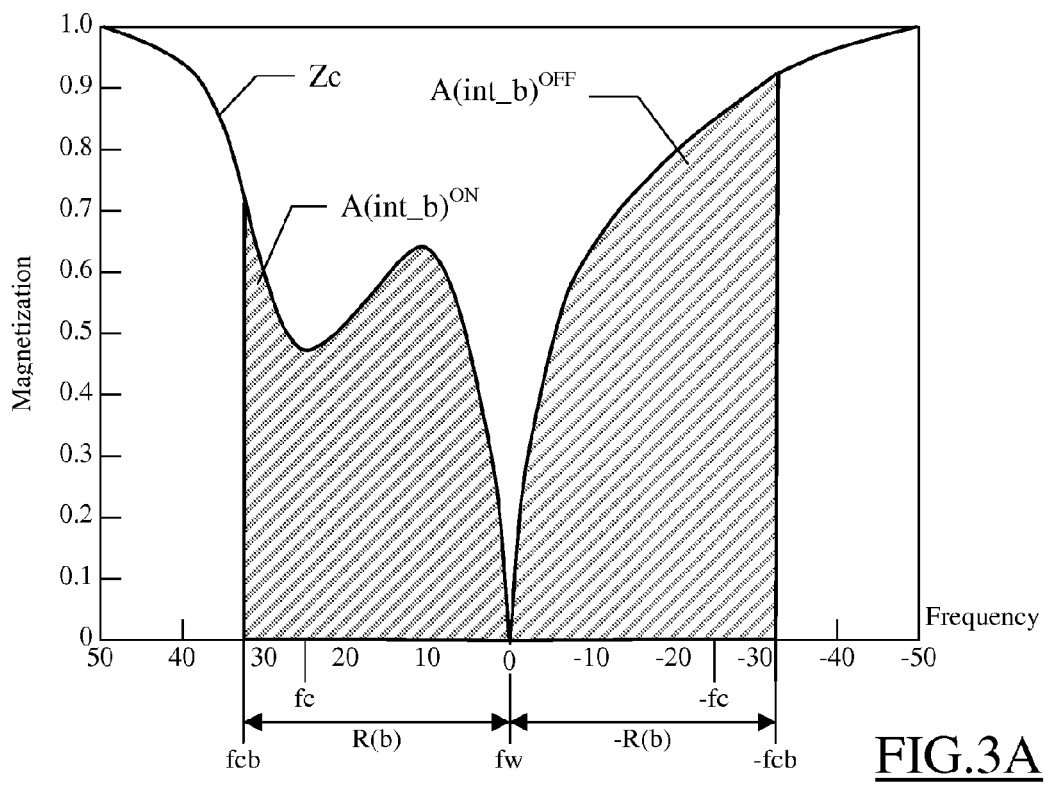
FIGS. 3A-3D show exemplary applications according to different embodiments.

Starting from FIG. 3A (showing the same Z-spectrum Zc as above), the frequency ranges that are used to define the composite values for measuring the saturation transfer start from the water frequency fw. Particularly, a CEST frequency range R(b) including the CEST frequency fc extends leftwards from the water frequency fw to a limit frequency fcb (lower than the CEST frequency fc); likewise, a reference frequency range −R(b) including the reference frequency −fc extends rightwards from the water frequency fw to an (opposite) limit frequency −fcb (higher than the reference frequency −fc). For example, the difference between the CEST frequency fc and the limit frequency fcb, and between the reference frequency −fc and the limit frequency −fcb is 2-20 ppm, and preferably 5-15 ppm (such as 10 ppm).

In this case (in a so-called integral bulk mode of implementation of an embodiment), a LEST value $A(\text{int\_b})^{ON}$ is calculated as the integral of the Z-spectrum Zc in the CEST frequency range R(b), and a reference value $A(\text{int\_b})^{OFF}$ is calculated as the integral of the Z-spectrum Zc in the reference frequency range −R(b). The saturation transfer may then be measured by a parameter referred to as Integral Bulk Saturation Transfer ST(int_b), which is calculated by the following formula:

$$ST(\text{int\_b}) = \left(1 - \frac{A(\text{int\_b})^{ON}}{A(\text{int\_b})^{OFF}}\right) = \left(\frac{A(\text{int\_b})^{OFF} - A(\text{int\_b})^{ON}}{A(\text{int\_b})^{OFF}}\right).$$

In this case, the (integral bulk) saturation transfer ST(int_b) ranges from 0 when no CEST effect is registered (since $A(\text{int\_b})^{OFF}=A(\text{int\_b})^{On}$) to 1 when the CEST effect is maximum (since $A(\text{int\_b})^{ON}=0$).

This embodiment may be particularly advantageous when the CEST peak is not clearly evident (for example, when the CEST frequency fc is close to the water frequency fw); indeed, the CEST frequency range R(b) and the reference frequency range −R(b) are very wide, so that the corresponding integrals take into account any asymmetry between the portion of the Z-spectrum including the CEST frequency fc (i.e., below the water frequency fw) and the portion of the Z-spectrum including the reference frequency −fc (i.e., above the water frequency fw).

Figure 3B:
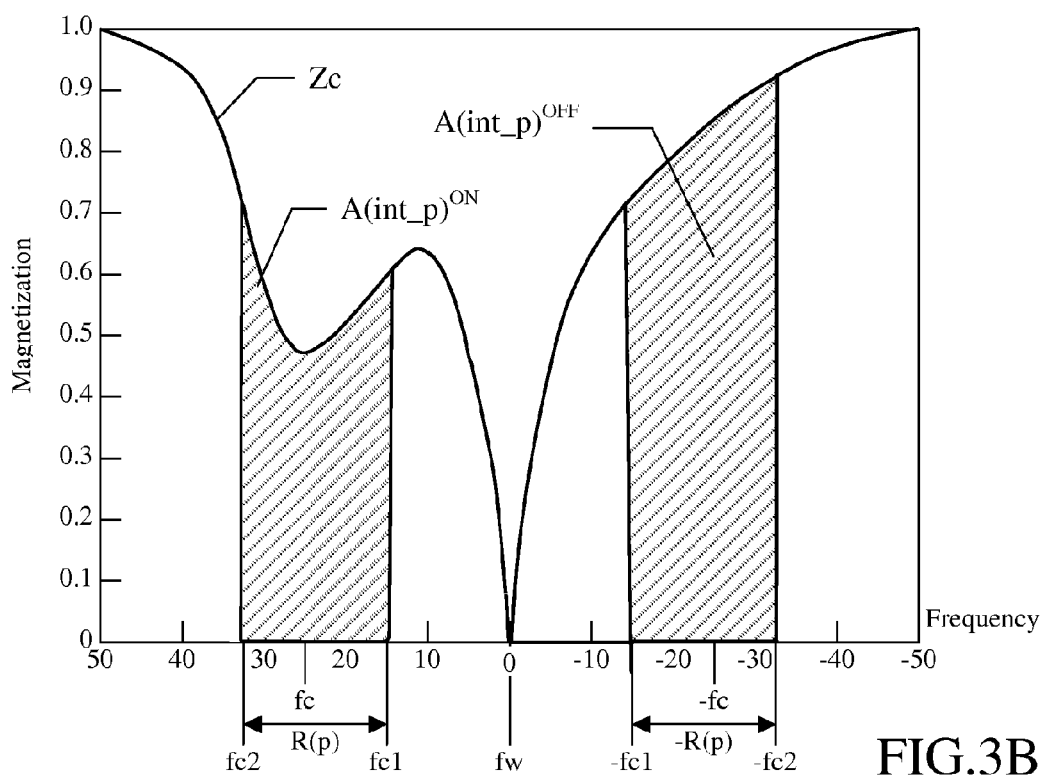

Moving to FIG. 3B (showing the same Z-spectrum Zc as above), the frequency ranges that are used to define the composite values for measuring the saturation transfer are instead centered around the CEST frequency fc and around the reference frequency −fc, respectively. Particularly, a CEST frequency range R(p) including the CEST frequency fc extends leftwards from a limit frequency fc1 (higher than the CEST frequency fc) to a limit frequency fc2 (lower than the CEST frequency fc), with fc1−fc=fc−fc2; likewise, a reference frequency range −R(p) including the reference frequency −fc extends rightwards from a limit frequency −fc1 (lower than the reference frequency −fc) to a limit frequency −fc2 (higher than the reference frequency −fc), with −fc−(−fc1)=−fc2−(−fc). For example, the difference between the CEST frequency fc and each corresponding limit frequency fc1 and fc2, and between the reference frequency −fc and each corresponding limit frequency −fc1 and −fc2 is 2-20 ppm, and preferably 5-15 ppm (such as 10 ppm).

In this case (in a so-called integral peak mode of implementation of an embodiment), a CEST value $A(\text{int\_p})^{ON}$ is calculated as the integral of the Z-spectrum Zc in the CEST frequency range R(p), and a reference value $A(\text{int\_p})^{OFF}$ is calculated as the integral of the Z-spectrum Zc in the reference frequency range −R(p). The saturation transfer may then be measured by a parameter referred to as Integral Peak Saturation Transfer ST(int_p), which is calculated by the following formula:

$$ST(\text{int\_p}) = \left(1 - \frac{A(\text{int\_p})^{ON}}{A(\text{int\_p})^{OFF}}\right) = \left(\frac{A(\text{int\_p})^{OFF} - A(\text{int\_p})^{ON}}{A(\text{int\_p})^{OFF}}\right).$$

As above, the (integral bulk) saturation transfer ST(int_p) ranges from 0 when no CEST effect is registered (since $A(\text{int\_p})^{OFF}=A(\text{int\_p})^{ON}$) to 1 when the CEST effect is maximum (since $A(\text{int\_p})^{ON}=0$). This embodiment may be particularly advantageous when the Z-spectrum includes artifacts that cause additional asymmetries with respect to the water frequency fw; indeed, in this case the extension of the CEST frequency range R(p) and of the reference frequency range −R(p) is limited to a neighborhood of the CEST frequency fc and of the reference frequency −fc, respectively, so that the corresponding integrals do not take into account the artifacts that are far away from the CEST frequency fc and the reference frequency −fc.

The same (CEST and reference) frequency ranges defined above (i.e., R(b)/−R(b) in FIG. 3A, and R(p)/−R(p) in FIG. 3B) may also be used to define alternative composite values that are based on complements of the corresponding integrals.

Figure 3C:
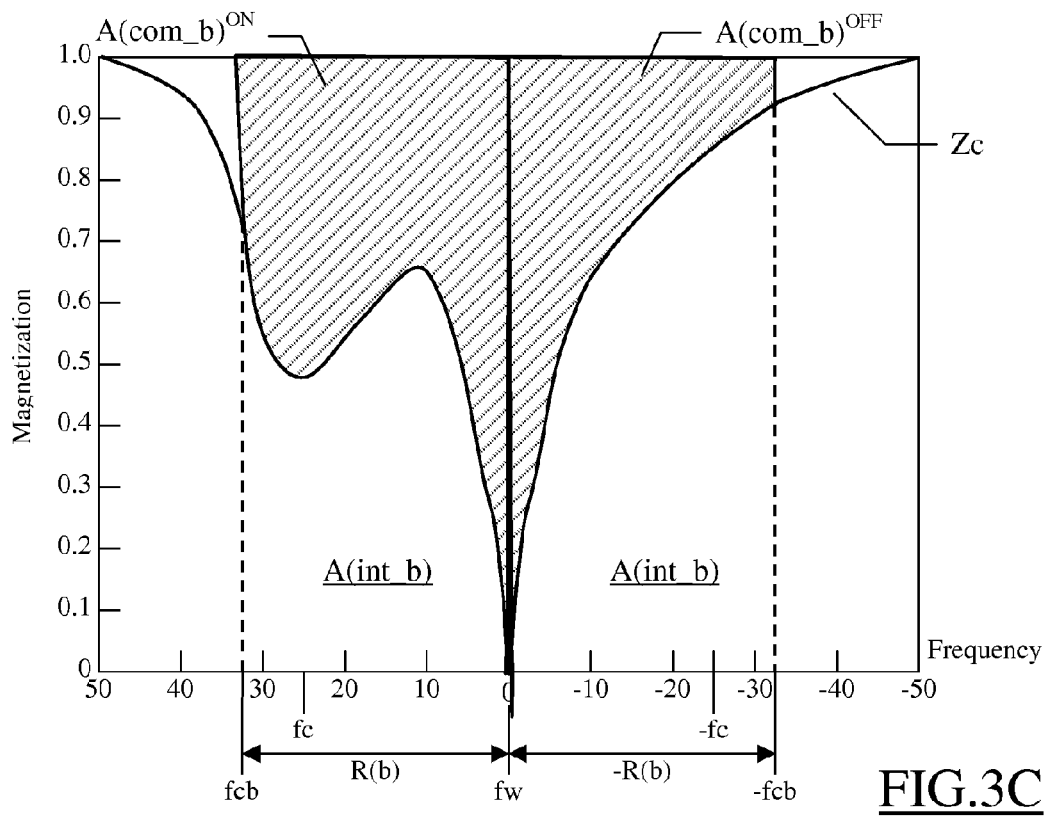

With reference in particular to FIG. 3C (showing the same Z-spectrum Zc), in a so-called complementary bulk mode of implementation of an embodiment a CEST value $A(\text{com\_b})^{ON}$ is calculated as the complement of the integral of the Z-spectrum Zc in the CEST frequency range R(b), and a reference value $A(\text{com\_b})^{OFF}$ is calculated as the complement of the integral of the Z-spectrum Zc in the reference frequency range −R(b). The LEST value $A(\text{com\_b})^{ON}$ is obtained by subtracting the corresponding CEST value $A(\text{int\_b})^{ON}$ from a maximum value A(int_b) equal to the area of a rectangle extending over the frequency range R(b) with a height equal to the maximum magnetization (1 in the example at issue)—i.e., $A(\text{com\_b})^{ON}=A(\text{int\_b})-A(\text{int\_b})^{ON}$; likewise, the reference value $A(\text{com\_b})^{OFF}$ is obtained by subtracting the corresponding reference value $A(\text{int\_b})^{OFF}$ from the same maximum value A(int_b) equal to the area of a rectangle extending over the frequency range—R(b) with a height equal to the maximum magnetization—i.e., $A(\text{com\_b})^{OFF}=A(\text{int\_b})-A(\text{int\_b})^{OFF}$. The saturation transfer may then be measured by a parameter referred to as Complementary Bulk Saturation Transfer ST(com_b), which is calculated by the following formula:

$$ST(\text{com\_b}) = \left(1 - \frac{A(\text{com\_b})^{ON}}{A(\text{com\_b})^{OFF}}\right) = -\left(\frac{A(\text{com\_b})^{OFF} - A(\text{com\_b})^{ON}}{A(\text{com\_b})^{OFF}}\right)$$

(wherein the sign − is added to obtain a positive value).

Figure 3D:
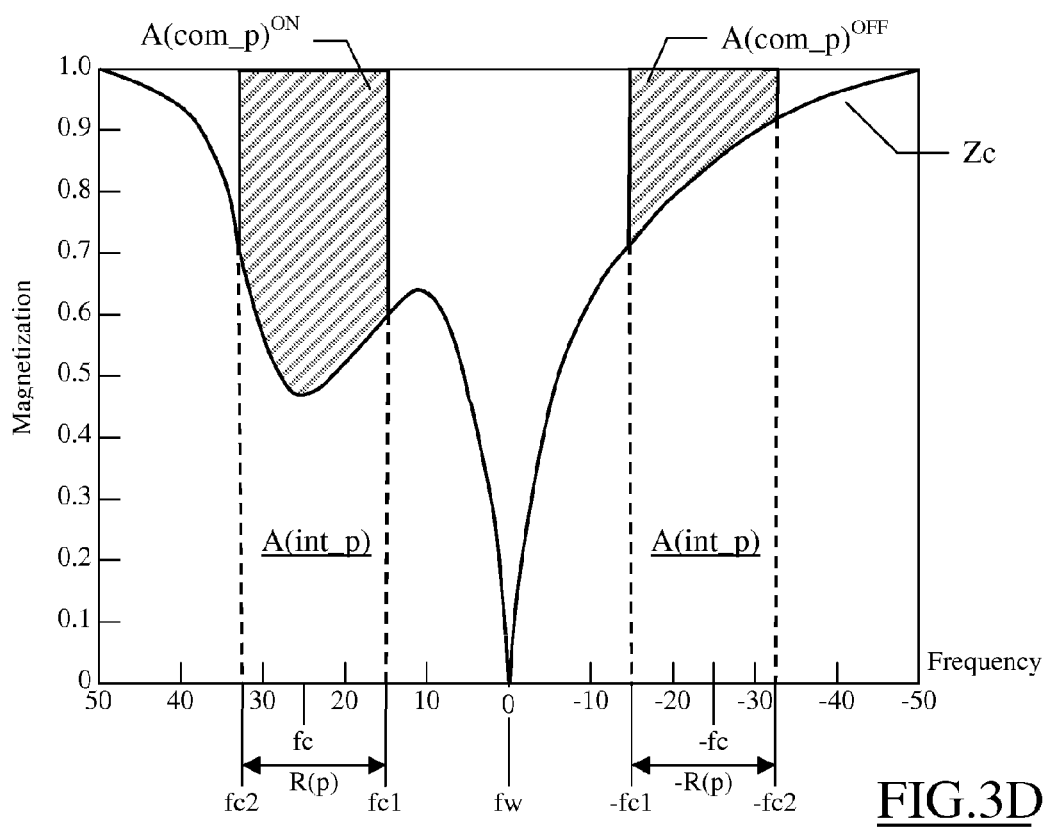

With reference now to FIG. 3D (showing the same Z-spectrum Zc), in a so-called complementary peak mode of implementation of an embodiment a CEST value $A(\text{com\_p})^{ON}$ is calculated as the complement of the integral of the Z-spectrum Zc in the CEST frequency range R(p), and a reference value $A(com\_p)^{OFF}$ is calculated as the complement of the integral of the Z-spectrum Zc in the reference frequency range—R(p). The LEST value $A(com\_p)^{ON}$ is obtained by subtracting the corresponding CEST value $A(int\_p)^{ON}$ from a maximum value $A(int\_p)$ equal to the area of a rectangle extending over the frequency range R(p) with a height equal to the maximum magnetization—i.e., ON $A(com\_p)=A(int\_p)-A(int\_p)^{ON}$; likewise, the reference value $A(com\_p)^{OFF}$ is obtained by subtracting the corresponding reference value $A(int\_p)^{OFF}$ from the same maximum value $A(int\_p)$ equal to the area of a rectangle extending over the frequency range –R(b) with a height equal to the maximum magnetization—i.e., $A(com\_p)^{OFF}=A(int\_p)-A(int\_p)^{OFF}$. The saturation transfer may then be measured by a parameter referred to as Complementary Peak Saturation Transfer ST(com_p), which is calculated by the following formula:

$$ST(com\_p) = -\left(1 - \frac{A(com\_p)^{ON}}{A(com\_p)^{OFF}}\right) = -\left(\frac{A(com\_p)^{OFF} - A(com\_p)^{ON}}{A(com\_p)^{OFF}}\right).$$

The same technique may also be used to measure the saturation transfer according to complements of the punctual values of the magnetization. More specifically, in a so-called complementary standard mode of implementation of an embodiment a CEST magnetization $I(com)^{ON}$ is calculated as the complement of the CEST magnetization $I^{ON}$, and a reference magnetization $I(com)^{OFF}$ is calculated as the complement of the reference magnetization $I^{OFF}$; The CEST magnetization $I(com)^{ON}$ and the reference magnetization $I(com)^{OFF}$ are obtained by subtracting the CEST magnetization $I^{ON}$ and the reference magnetization $I^{OFF}$, respectively, from the maximum magnetization—i.e., $I(com)^{ON}=1-I^{ON}$ and $I(com)^{OFF=1}-I^{OFF}$. The saturation transfer may then be measured by a parameter referred to as Complementary Standard Saturation Transfer ST(com), which is calculated by the following formula:

$$ST(com) = -\left(1 - \frac{I(com)^{ON}}{I(com)^{OFF}}\right) = -\left(\frac{I(com)^{OFF} - I(com)^{ON}}{I(com)^{OFF}}\right).$$

The (complementary bulk) saturation transfer ST(com_b), the (complementary peak) saturation transfer ST(com_p), and the (complementary standard) saturation transfer ST(com) range from 0 when no CEST effect is registered (since $A(com\_b)^{OFF}=A(com\_b)^{ON}$, $A(com\_p)^{OFF}=A(comp)^{ON}$, and $I^{=OFF}=I^{ON}$) to a value tending to ∞ (when $A(com\_b)^{OFF}$, $A(com\_p)^{OFF}$, and $I(com)^{oFF}$ are equal to 0).

These embodiments (i.e., all the complementary modes) may be particularly advantageous when the Z-spectrum Zc exhibits high magnetizations at the CEST frequency fc and at the reference frequency –fc (for example, higher than 0.5); indeed, in this case a weight of the asymmetries (between the portion of the Z-spectrum Zc including the CEST frequency fc and the portion of the Z-spectrum including the reference frequency –fc) is higher in relative terms—with respect to the corresponding (complementary) values of the magnetization that are lower than the corresponding (original) values of the magnetization. Indeed, with reference to the complementary standard mode for the sake of simplicity, when the magnetizations $I^{ON}$ and $I^{OFF}$ are low, the saturation transfers ST and ST(com) are comparable; for example, for $I^{ON}=0.4$ and $I^{OFF}=0.475$ there is obtained:

$$ST = \left(\frac{I^{OFF} - I^{ON}}{I^{OFF}}\right)$$
$$= \left(\frac{0.475 - 0.4}{0.475}\right)$$
$$= 0.16,$$

and $$ST(com) = \left(\frac{I(com)^{OFF} - I(com)^{ON}}{I(com)^{OFF}}\right)$$
$$= -\left(\frac{(1 - 0.475) - (1 - 0.4)}{(1 - 0.475)}\right)$$
$$= 0.14.$$

Conversely, when the magnetizations $I^{ON}$ and $I^{OFF}$ are high, the saturation transfer ST(com) is far higher than the saturation transfer ST; for example, for $I^{ON}=0.8$ and $I^{OFF}=0.95$ there is obtained:

$$ST = \left(\frac{I^{OFF} - I^{ON}}{I^{OFF}}\right) = \left(\frac{0.95 - 0.8}{0.95}\right) = 0.16, \text{ and}$$

$$ST(com) = -\left(\frac{I(com)^{OFF} - I(com)^{ON}}{I(com)^{OFF}}\right) = -\left(\frac{(1 - 0.95) - (1 - 0.8)}{(1 - 0.95)}\right) = 3.$$

The same composite values defined above (i.e., $A(int\_b)^{ON}/A(int\_b)^{OFF}$ in FIG. 3A, $A(int\_p)^{ON}/A(int\_p)^{OFF}$ in FIG. 3B, $A(com\_b)^{ON}/A(com\_b)^{OFF}$ in FIG. 3C, and $A(com\_p)^{ON}/A(com\_p)^{OFF}$ in FIG. 3D) may also be used to define alternative parameters measuring the saturation transfer.

For example, in a so-called enhanced mode of implementation of an embodiment the parameters measuring the saturation transfer are calculated with reference to the composite values relating to the CEST frequency fc (instead of the composite values relating to the reference frequency –fc). Particularly, in an enhanced integral bulk mode of implementation the saturation transfer may be measured by a parameter referred to as Enhanced Integral Bulk Saturation Transfer ST(en_int_b), which is calculated by the following formula:

$$ST(en\_int\_b) = -\left(1 - \frac{A(en\_int\_b)^{OFF}}{A(en\_int\_b)^{ON}}\right)$$
$$= -\left(\frac{A(en\_int\_b)^{ON} - A(en\_int\_b)^{OFF}}{A(en\_int\_b)^{ON}}\right),$$

and in an enhanced integral peak mode of implementation the saturation transfer may be measured by a parameter referred to as Enhanced Integral Peak Saturation Transfer ST(en_int_p), which is calculated by the following formula:

$$ST(en\_int\_p) = -\left(1 - \frac{A(en\_int\_p)^{OFF}}{A(en\_int\_p)^{ON}}\right)$$
$$= -\left(\frac{A(en\_int\_p)^{ON} - A(en\_int\_p)^{OFF}}{A(en\_int\_p)^{ON}}\right).$$

Likewise, in an enhanced complementary bulk mode of implementation the saturation transfer may be measured by a parameter referred to as Enhanced Complementary Bulk Saturation Transfer ST(en_com_b), which is calculated by the following formula:

$$ST(\text{en\_com\_b}) = \left(1 - \frac{A(\text{en\_com\_b})^{OFF}}{A(\text{en\_com\_b})^{ON}}\right)$$
$$= \left(\frac{A(\text{en\_com\_b})^{ON} - A(\text{en\_com\_b})^{OFF}}{A(\text{en\_com\_b})^{ON}}\right),$$

and in an enhanced complementary peak mode of implementation the saturation transfer may be measured by a parameter referred to as Enhanced Complementary Peak Saturation Transfer ST(en_comp), which is calculated by the following formula:

$$ST(\text{en\_com\_p}) = \left(1 - \frac{A(\text{en\_com\_p})^{OFF}}{A(\text{en\_com\_p})^{ON}}\right)$$
$$= \left(\frac{A(\text{en\_com\_p})^{ON} - A(\text{en\_com\_p})^{OFF}}{A(\text{en\_com\_p})^{ON}}\right)$$

The same technique may also be used to measure the saturation transfer according to the punctual values of the magnetization, by calculating it with reference to the CEST magnetization $I^{ON}$ (instead of the reference magnetization $I^{OFF}$). Particularly, in an enhanced standard mode of implementation the saturation transfer may be measured by a parameter referred to as Enhanced Standard Saturation Transfer ST(en), which is calculated by the following formula:

$$ST(\text{en}) = -\left(1 - \frac{I^{OFF}}{I^{ON}}\right) = -\left(\frac{I^{ON} - I^{OFF}}{I^{ON}}\right).$$

Likewise, in an enhanced complementary standard mode of implementation the saturation transfer may be measured by a parameter referred to as Enhanced Complementary Standard Saturation Transfer ST(en_com), which is calculated by the following formula:

$$ST(\text{en\_com}) = \left(1 - \frac{I(\text{com})^{OFF}}{I(\text{com})^{ON}}\right) = \left(\frac{I(\text{com})^{ON} - I(\text{com})^{OFF}}{I(\text{com})^{ON}}\right).$$

In this case, the (enhanced integral bulk) saturation transfer ST(en_int_b), the (enhanced integral peak) saturation transfer ST(en_int_p), the (enhanced complementary bulk) saturation transfer ST(en_com_b), the (enhanced complementary peak) saturation transfer ST(en_com_p), the (enhanced standard) saturation transfer ST(en), and the (enhanced complementary standard) saturation transfer ST(en_com) range from 0 when no CEST effect is registered (since $A(\text{int\_b})^{OFF} = A(\text{int\_b})^{ON}$, $A(\text{int\_p})^{OFF} = A(\text{int\_p})^{ON}$, $A(\text{com\_b})^{OFF} = A(\text{com\_b})^{ON}$, $A(\text{com\_p})^{OFF} = A(\text{com\_p})^{ON}$, $I^{OFF} = I^{ON}$, and $I(\text{com})^{OF} = I(\text{com})^{ON}$) to a value tending to ∞ (when $A(\text{int\_b})^{ON}$, $A(\text{int\_p})^{ON}$, $A(\text{com\_b})^{ON}$, $A(\text{com\_p})^{ON}$, $I^{ON}$, and $I(\text{com})^{ON}$ are equal to 0).

These embodiments (i.e., all the enhanced modes) are particularly advantageous when the CEST effect is high; indeed, in this case the saturation transfers ST(en_int_b), ST(en_int_p), ST(en_com_b), ST(en_com_p), ST(en) and ST(en_com) strongly increase, so that high differences thereof are provided even for small reductions of the magnetizations relating to the CEST frequency fc (i.e., $A(\text{int\_b})^{ON}$, $A(\text{int\_p})^{ON}$, $A(\text{com\_b})^{ON}$, $A(\text{com\_p})^{ON}$, $I^{ON}$, and $I(\text{com})^{ON}$).

Figure 4:
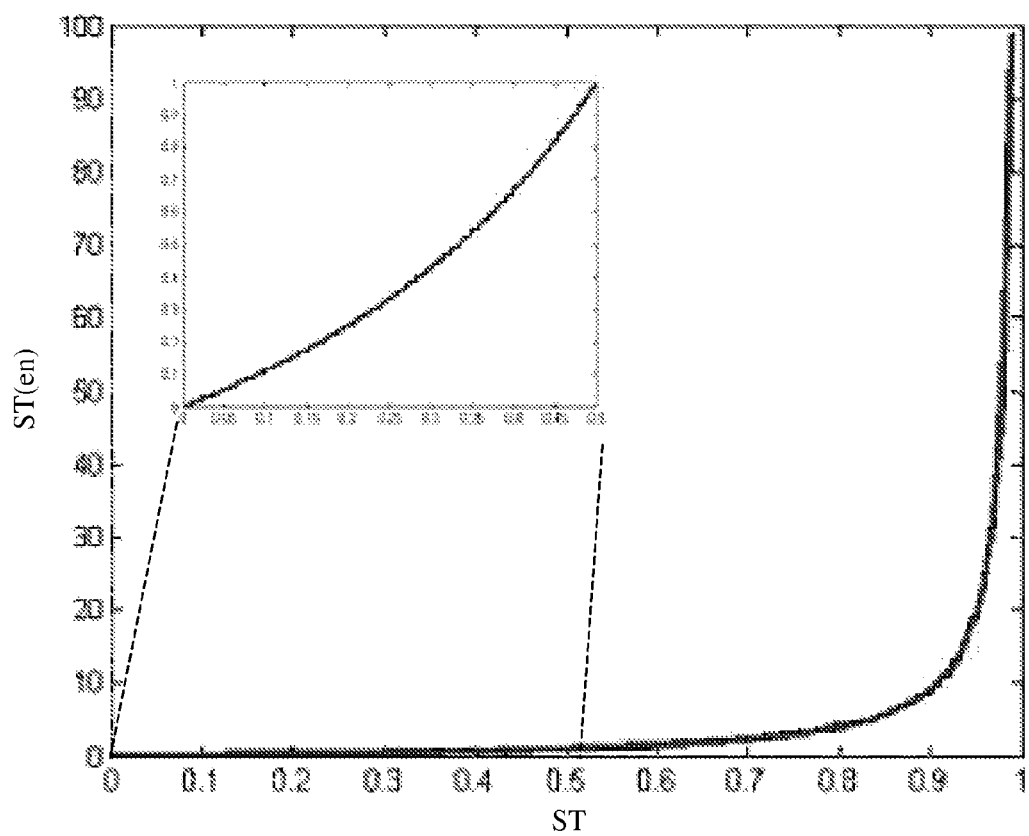
FIG. 4 is an illustrative comparison between an embodiment and a standard technique known in the art.

For example, an illustrative comparison between the saturation transfer ST (for the standard mode) and the saturation transfer ST(en) (for the enhanced standard mode) is represented in FIG. 4 with a graph, which plots the saturation transfer ST(en) on the ordinate-axis (from 0 up to 100) against the corresponding saturation transfer ST for the same values of the magnetizations $I^{ON}$ and $I^{OFF}$ on the abscissa-axis (from 0 to 1). As may be seen, the saturation transfers ST(en) and ST are of the same order of magnitude for ST<0.5 (as clearly evident in the enlarged view of the corresponding portion of the graph). Conversely, for ST>0.5 any difference between the saturation transfers ST is strongly amplified in the corresponding saturation transfers ST(en).

Alternatively, in a so-called combined mode of implementation of an embodiment the parameters measuring the saturation transfer are calculated by combining the composite values with the corresponding punctual values of the magnetization. Particularly, in a combined integral bulk mode of implementation the saturation transfer may be measured by a parameter referred to a Combined Integral Bulk Saturation Transfer ST(cb_int_b), which is calculated by the following formula:

$$ST(\text{cb\_int\_b}) = 1 - \left(\frac{I^{ON}}{I^{OFF}} \cdot \frac{A(\text{int\_b})^{ON}}{A(\text{int\_b})^{OFF}}\right),$$

and in a combined integral peak mode of implementation the saturation transfer may be measured by a parameter referred to as Combined Integral Peak Saturation Transfer ST(cb_int_p), which is calculated by the following formula:

$$ST(\text{cb\_int\_p}) = 1 - \left(\frac{I^{ON}}{I^{OFF}} \cdot \frac{A(\text{int\_p})^{ON}}{A(\text{int\_p})^{OFF}}\right).$$

Moreover, in a combined complementary bulk mode of implementation the saturation transfer may be measured by a parameter referred to as Combined Complementary Bulk Saturation Transfer ST(cb_com_b), which is calculated by the following formula:

$$ST(\text{cb\_com\_b}) = -\left(1 - \left(\frac{I^{ON}}{I^{OFF}} \cdot \frac{A(\text{com\_b})^{ON}}{A(\text{com\_b})^{OFF}}\right)\right),$$

and in a combined complementary peak mode of implementation the saturation transfer may be measured by a parameter referred to as Combined Complementary Peak Saturation Transfer ST(cb_com_p), which is calculated by the following formula:

$$ST(\text{cb\_com\_p}) = -\left(1 - \left(\frac{I^{ON}}{I^{OFF}} \cdot \frac{A(\text{com\_p})^{ON}}{A(\text{com\_p})^{OFF}}\right)\right).$$

Likewise, in a combined enhanced integral bulk mode of implementation the saturation transfer may be measured by a parameter referred to as Combined Enhanced Integral Bulk Saturation Transfer ST(cb_en_int_b), which is calculated by the following formula:

$$ST(\text{cb\_en\_int\_b}) = -\left(1 - \left(\frac{I^{OFF}}{I^{ON}} \cdot \frac{A(\text{int\_b})^{OFF}}{A(\text{int\_b})^{ON}}\right)\right),$$

and in a combined enhanced integral peak mode of implementation the saturation transfer may be measured by a parameter referred to as Combined Enhanced Integral Peak Saturation Transfer ST(cb_en_int_p), which is calculated by the following formula:

$$ST(\text{cb\_en\_int\_p}) = -\left(1 - \left(\frac{I^{OFF}}{I^{ON}} \cdot \frac{A(\text{int\_p})^{OFF}}{A(\text{int\_p})^{ON}}\right)\right).$$

Moreover, in a combined enhanced complementary bulk mode of implementation the saturation transfer may be measured by a parameter referred to as Combined Enhanced Complementary Bulk Saturation Transfer ST(cb_en_com_b), which is calculated by the following formula:

$$ST(\text{cb\_en\_com\_b}) = 1 - \left(\frac{I^{OFF}}{I^{ON}} \cdot \frac{A(\text{com\_b})^{OFF}}{A(\text{com\_b})^{ON}}\right),$$

and in a combined enhanced complementary peak mode of implementation the saturation transfer may be measured by a parameter referred to as Combined Enhanced Complementary Peak Saturation Transfer ST(cb_en_com_p), which is calculated by the following formula:

$$ST(\text{cb\_en\_com\_p}) = -\left(1 - \left(\frac{I^{OFF}}{I^{ON}} \cdot \frac{A(\text{com\_p})^{OFF}}{A(\text{com\_p})^{ON}}\right)\right).$$

In this case, the (combined integral bulk) saturation transfer ST(cb_int_b), the (combined integral peak) saturation transfer ST(cb_int_p), the (combined complementary bulk) saturation transfer ST(cb_com_b), and the (combined complementary peak) saturation transfer ST(cb_com_p) range from 0 when no CEST effect is registered (since $A(\text{int\_b})^{OFF} = A(\text{int\_b})^{ON}$, $A(\text{int\_p})^{OFF} = A(\text{int\_p})^{ON}$, $A(\text{com\_b})^{OFF} = A(\text{com\_b})^{ON}$, $A(\text{com\_p})^{OFF} = A(\text{com\_p})^{ON}$, and $I^{OFF} = I^{ON}$) to 1 when the CEST effect is maximum (since $I^{ON} = 0$). Instead, the (combined enhanced integral bulk) saturation transfer ST(cb_en_int_b), the (combined enhanced integral peak) saturation transfer ST(cb_en_int_p), the (combined enhanced complementary bulk) saturation transfer ST(cb_en_com_b) and the (combined enhanced complementary peak) saturation transfer ST(cb_en_com_p) range from 0 when no CEST effect is registered (since $A(\text{int\_b})^{OFF} = A(\text{int\_b})^{ON}$, $A(\text{int\_p})^{OFF} = A(\text{int\_p})^{ON}$, $A(\text{com\_b})^{OFF} = A(\text{com\_b})^{ON}$, $A(\text{com\_p})^{OFF} = A(\text{com\_p})^{ON}$, and $I^{OFF} = I^{ON}$) to a value tending to ∞ (when $I^{ON} = 0$).

These embodiments (i.e., all the combined modes) further increase the saturation transfers ST(cb_int_b), ST(cb_int_p), ST(cb_com_b), ST(cb_com_p), ST(cb_en_int_b), ST(cb_en_int_p), ST(cb_en_com_b), and ST(cb_en_com_p) when a high difference exists between the (punctual) magnetizations $I^{ON}$ and $I^{OFF}$ (in addition to the specific advantages already pointed-out above).

Generally, the best mode of operation may be selected by an operator of the scanner according to the circumstances (for example, the intensity of the saturation pulses, the shape of the Z-spectrum without the CEST effect, the CEST offset, and the like).

Figure 5:
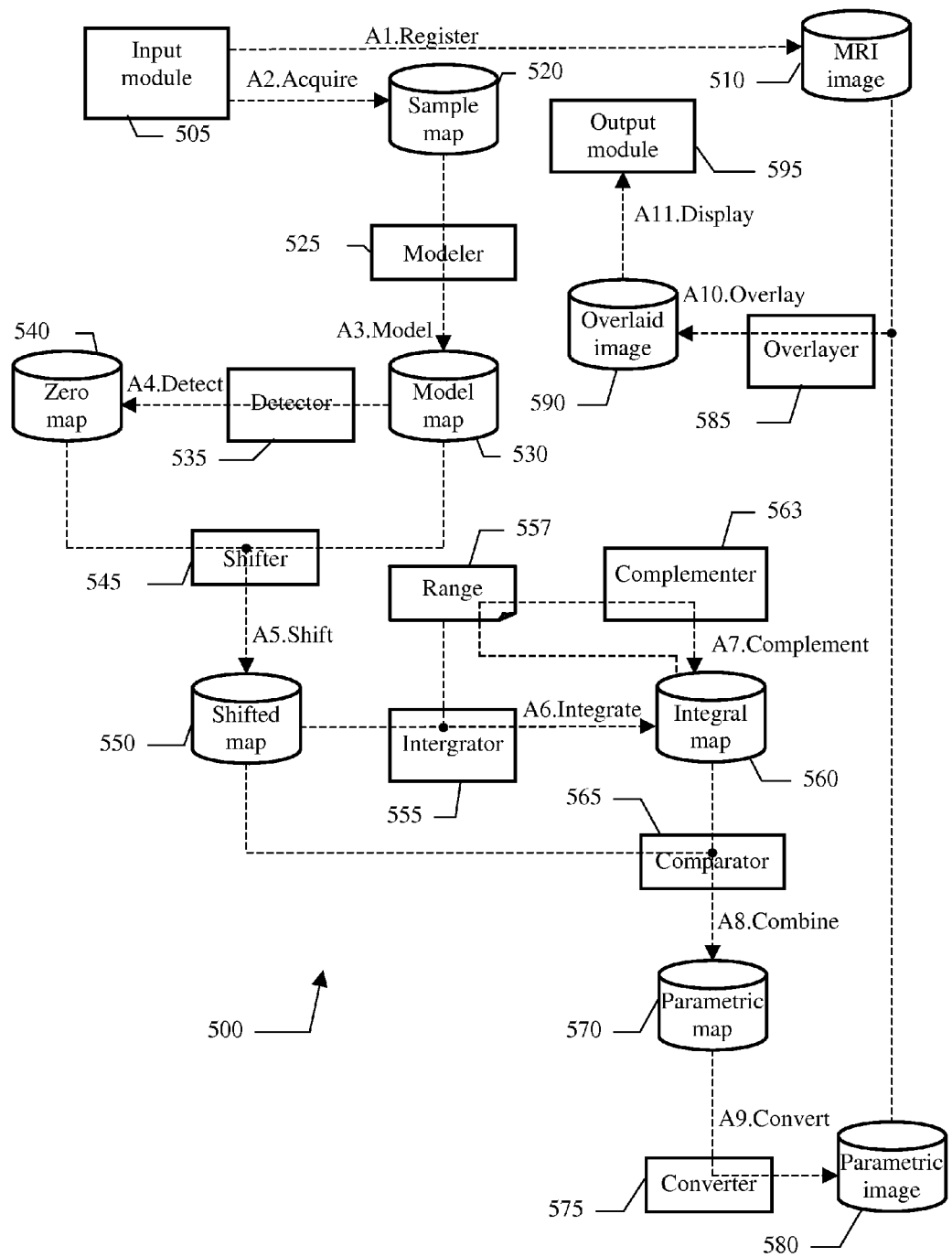
FIG. 5 shows a diagram representing the roles of the main software components that may be used to implement an embodiment.

A collaboration diagram representing the main software components that may be used to implement an embodiment is illustrated in FIG. 5. These components are denoted as a whole with the reference 500; particularly, the information (programs and data) is typically stored on the hard-disk and loaded (at least partially) into the working memory of a data processing system (for example, the scanner or a distinct personal computer) when the programs are running, together with an operating system and other application programs (not shown in the figure). The programs are initially installed onto the hard disk, for example, from DVD-ROM. More specifically, the figure describes the static structure of the system (by means of the corresponding components) and its dynamic behavior (by means of a series of exchanged messages, each one representing a corresponding action, denoted with sequence numbers preceded by the symbol "A").

Particularly, an input module 505 includes a driver that controls operation of the scanner. Particularly, when a generic body-part of a patient is to be analyzed, a specific CEST contrast agent (for a corresponding target region) is administered to the patient (for example, intravenously by hand with a syringe). Once the patient has been inserted into the tunnel of the scanner, the input module is at first actuated in the (standard) MRI mode. For each location of a specific slice of the body-part (selected by the gradient coil in succession), the RF coil applies a magnetic pulse at the water frequency fw, and registers the resulting (analog) RF magnetic response signal (measuring the transverse component of the corresponding magnetization). The response signals of all the locations of the body-part are amplified and converted into digital values in a video format. This process generates a (video) MRI image of the body-part, which MRI image is stored into a corresponding file 510 (action "A1.Register")—hereinafter, the different memory structures and their contents will be denoted with the tame references for the sake of simplicity. The MRI image 510 is defined by a matrix (for example, with 256 rows×256 columns) with a cell for each visualizing element (i.e., voxel) corresponding to a location of the body-part. Each cell includes a voxel value (for example, coded on 8 bits) that defines a brightness of the voxel; for example, in a gray scale MIR image 510 the voxel value increases from 0 (black) to 255 (white) as a function of the intensity of the corresponding magnetization (representing the corresponding location of the body-part). In this way, the MRI image 510 provides a representation of the morphology of the body-part.

The input module 505 is then actuated in the MRI-CEST mode. For each group of locations of the same body-part (for example, each one consisting of 4×4 locations), the RF coil at first applies a saturation pulse at the CEST frequency; the RF coil then applies a series of magnetic pulses in the working frequency range, and registers the resulting (analog) RF magnetic response signals. The magnetic pulses are selected, in order to limit any loss of information in the corresponding response signals according to the Shannon theorem, with a short sampling step (as defined by their frequency difference) where the response signals exhibit steep variations (i.e., in the neighborhoods of the water frequency fw and of the CEST frequency fc), while they may be selected with a wider sampling step where the response signals exhibit smooth variations; for example, a sampling step of 1 ppm is used in the range of ±1 ppm around the water frequency fw and around the CEST frequency fc, while a sampling step of ±5 ppm is used elsewhere (so as to register a set of about 30-50 response signals). The sets of response signals of all the locations of the body-part are amplified and converted into digital values; this operation generates a sample map, which is stored into a corresponding file 520 (action "A2.Acquire"). The sample map 520 is defined by a matrix with a cell for each group of locations; each cell of the sample map 520 includes a sample array, which is formed by the sample values of the magnetization of the corresponding group of locations throughout the working frequency range. Therefore, the sample map 520 will have a lower resolution than the MIR image 510 (for example, with 64 rows×64 columns)—since this is required to maintain the time for acquiring it at a reasonable value (for example, 15-30 min.).

A modeler 525 accesses the sample map 520. For each cell of the sample map 520, the modeler 525 associates the corresponding sample array with an instance of a model function representing the corresponding Z-spectrum (defined by values of a set of model parameters)—hereinafter, the model function and its instances will be denoted with the same references for the sake of simplicity; the model function is determined by an optimization process selecting the values of these model parameters that provide the best fitting of the sample array. For example, the model function is a cubic spline, which is determined by an optimization process of the smoothing spline type. The modeler 525 then calculates the maximum value of the model function so obtained, and normalizes it to this value. The whole operation generates a model map, which is stored into a corresponding file 530 (action "A3.Model"); for each group of locations, the model map 530 has a cell including the sample parameters defining the corresponding (normalized) model function.

A detector 535 in turn accesses the model map 530. For each cell of the model map 530, the detector 535 calculates a central frequency providing a minimum value of the model function (assumed to be the water frequency fw in the corresponding Z-spectrum). The operation generates a zero map, which is stored into a corresponding file 540 (action "A4.Detect"); for each group of locations, the zero map 540 has a cell including the corresponding central frequency.

A shifter 545 accesses both the model map 530 and the zero map 540. For each cell of the model map 530, the shifter 545 shifts the corresponding model function so that its central frequency (as defined in the zero map 540) corresponds to the origin (0). The operation generates a shifted map, which is stored into a corresponding file 550 (action "A5.Shift"); for each group of locations, the shifted map 550 has a cell including the sample parameters defining the corresponding (shifted) model function. This feature locally compensates errors in the Z-spectrum of each cell, which may be caused by heterogeneities in the corresponding group of locations of the body-part or by variations of the actual water frequency fw with respect to its theoretical value (for example, depending on the position of the locations within the body-part).

An integrator 555 accesses the shifted map 550 and a working table 557, which stores the definition of the CEST and reference frequency ranges; the CEST and reference frequency ranges 557 are defined according to the mode of operation of the scanner (i.e., bulk-based or peak-based), and according to the CEST frequency fc of the specific CEST contrast agent that was administered to the patient (as input by the operator at the beginning of the analysis process). For each cell of the shifted map 560, the integrator 555 calculates the integrals of its model function in the CEST frequency range and in the reference frequency range, respectively. The operation generates an integral map, which is stored into a corresponding file 560 (action "A6.Integrate"); for each group of locations, the integral map 560 has a cell including the corresponding integrals.

A complementer 563 accesses the integral map 560 and the working table 557. Optionally (when the operator has selected a complementary mode at the beginning of the analysis process), the complementer 563 calculates the complements of the integrals of each cell of the integral map 560 (with respect to the corresponding maximum value). The combiner 563 then replaces the integrals of each cell of the integral map 560 with their complements so obtained (action "A7.Complement").

A comparator 565 accesses the integral map 560 and the shifted map 550. For each cell of the integral map 560, the combiner calculates the corresponding saturation transfer, according to one of the above-described modes (i.e., integral, complementary, enhanced or combined), as selected by the operator at the beginning of the analysis process. For this purpose, the comparator 565 exploits the corresponding integrals (or their complements) in the integral map 560; moreover, in the combined modes the comparator 565 also exploits the CEST magnetization and the reference magnetization, which are calculated from the corresponding model function in the shifted map 550. The operation generates a parametric map, which is stored into a corresponding file 575 (action "A8.Combine"); for each group of locations, the parametric map 575 has a cell including the corresponding saturation transfer.

A converter 575 accesses the parametric map 570. For each cell of the parametric map 570, the converter 575 converts the corresponding saturation transfer for display purposes. For example, each saturation transfer is converted to a discrete value consisting of 128 levels that are uniformly distributed between the lowest value and the highest value of all the saturation transfers in the parametric map 570, by possibly applying a gain factor. A color lookup table (not shown in the figure) is then used to associate all the possible levels with the representation of corresponding colors (that are preferably brighter as the levels increase); for example, each color is defined by an index for accessing a location within a palette containing its actual specification. The converter 575 also expands the parametric map 570 to the size of the MRI image 510 (256 rows×256 columns in the example at issue). For this purpose, the saturation transfer of each cell (in the parametric map 570) is replicated for the corresponding group of voxels and then filtered spatially (for example, using a low-pass spatial filter). The operation generates a parametric image, which is stored into a corresponding file 580 (action "A9.Convert"); for each voxel, the parametric image 580 then includes the corresponding (color-coded) saturation transfer.

An overlayer 585 superimposes the parametric image 580 on the MRI image 510 in transparency. For this purpose, an overlay mask is generated from the parametric image 580, by assigning (to each voxel) the logic value 1 if its saturation transfer is strictly higher than a predefined threshold or the logic value 0 otherwise (for example, with the threshold ranging from 0 to 5% of the highest saturation transfer in the parametric image 580). An inverted overlay mask is then generated from the overlay mask (by exchanging the logic values 0 and 1). At this point, the overlayer 585 generates a masked parametric image by multiplying the parametric image 580 by the overlay mask voxel-by-voxel (so as to maintain the voxel values that are higher than the threshold value, while the other voxel values are reset to 0); at the same time, the overlayer 585 generates a masked MRI input image by multiplying the MRI image 510 by the inverted overlay mask voxel-by-voxel (so at to maintain the voxel values of the MRI image 510 that are not included in the masked parametric image, while the other voxel values are reset to 0). The overlayer 585 then adds the masked parametric image and the masked MRI image voxel-by-voxel, so as to obtain an overlaid image that is stored into a corresponding file 590 (action "A10.Overlay"); for each voxel, the overlaid image 590 then includes the corresponding voxel value of the parametric image 580 if it is higher then the threshold value, or the corresponding voxel value of the MRI image 510 otherwise. In this way, the voxel values of the parametric image 580 (representing their saturation transfers) override the voxel values of the MRI image 510 (representing their magnetizations) only if they have a significant value (i.e., higher than the threshold value). The overlaid image 490 is then supplied to an output module 595 which provides it to the operator—for example, causing its displaying on the monitor of the scanner (action "A11.Display").

Experimental Results

The above-described modes according to different embodiments (i.e., the integral bulk mode, the integral peak mode, the complementary bulk mode, the complementary peak mode, the complementary standard mode, the enhanced integral bulk mode, the enhanced integral peak mode, the enhanced complementary bulk mode, the enhanced complementary peak mode, the enhanced standard mode, the enhanced complementary standard mode, the combined integral bulk mode, the combined integral peak mode, the combined complementary bulk mode, the combined complementary peak mode, the combined enhanced integral bulk mode, the combined enhanced integral peak mode, the combined enhanced complementary bulk mode, and the combined enhanced complementary peak mode) were tested and compared with the standard mode in silico.

Figure 6A:
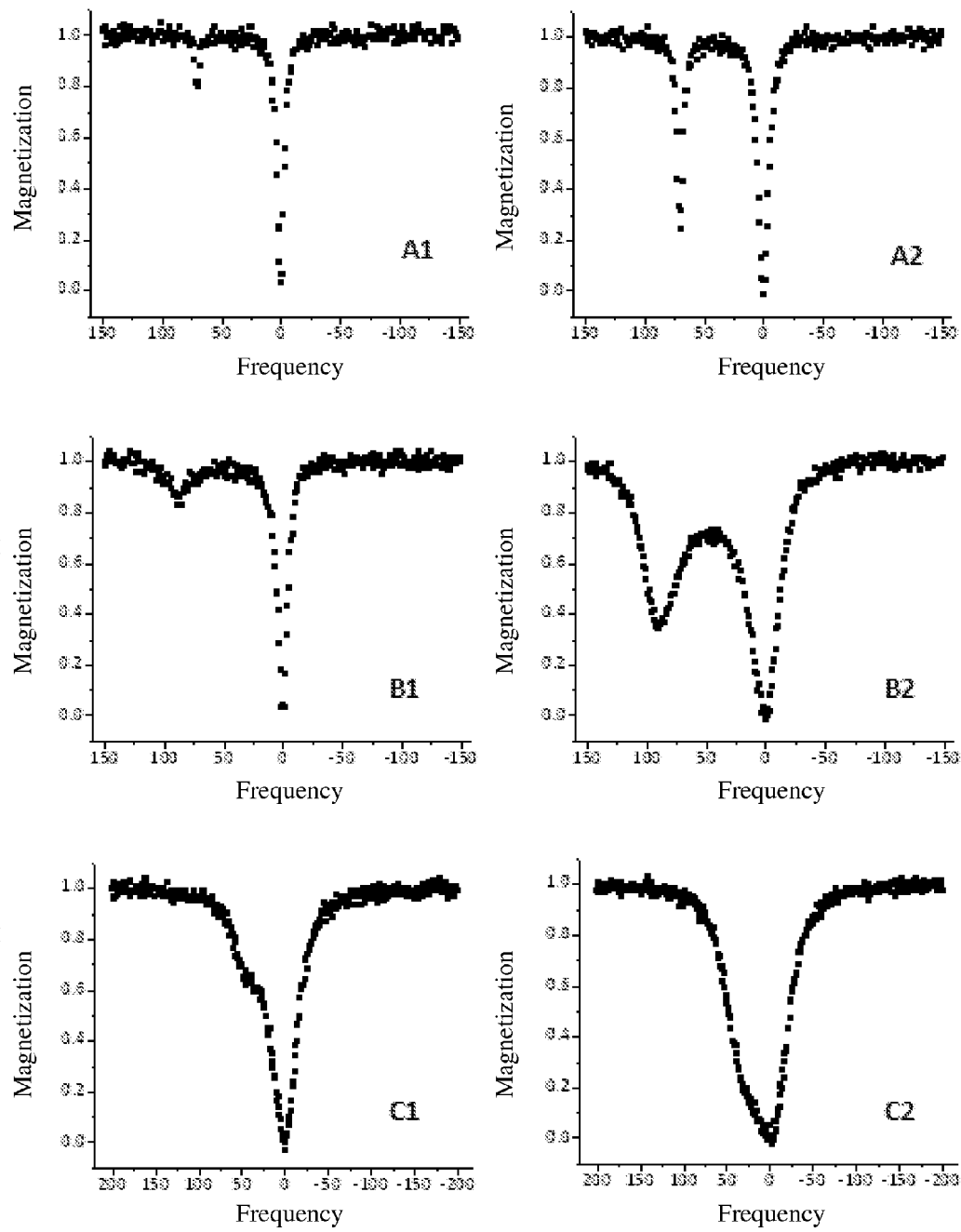
FIGS. 6A-6F shows exemplary in silico applications of different embodiments with corresponding comparisons thereof.

For this purpose, as shown in FIG. 6A, simulated Z-spectra were obtained by using the numerical model described in "Woessner D E, Zhang S, Merritt M E, Sherry A D. Numerical solution of the Bloch equations provides insights into the optimum design of PARACEST agents for MRI. *Magn Reson Med.* 2005, 53:790-799" (the entire disclosure of which is herein incorporated by reference). Particularly, 6 different Z-spectra (denoted with the references A1, A2, B1, B2, C1 and C2) were generated with different extensions of the bulk peak, the CEST peak, the CEST offset, and the concentration of the CEST agent. Furthermore, a Gaussian error of 10% was applied on the simulated Z-spectra in order to better mimic real experiments.

The performance of each mode of operation was expressed in terms of their CNR, being normalized to the CNR of the standard mode; the CNR of each mode of operation was calculated as the ratio between the saturation transfer with the CEST effect and the standard deviation of the saturation transfers in multiple Z-spectra with no CEST effect (5 in the example at issue).

Figure 6B:
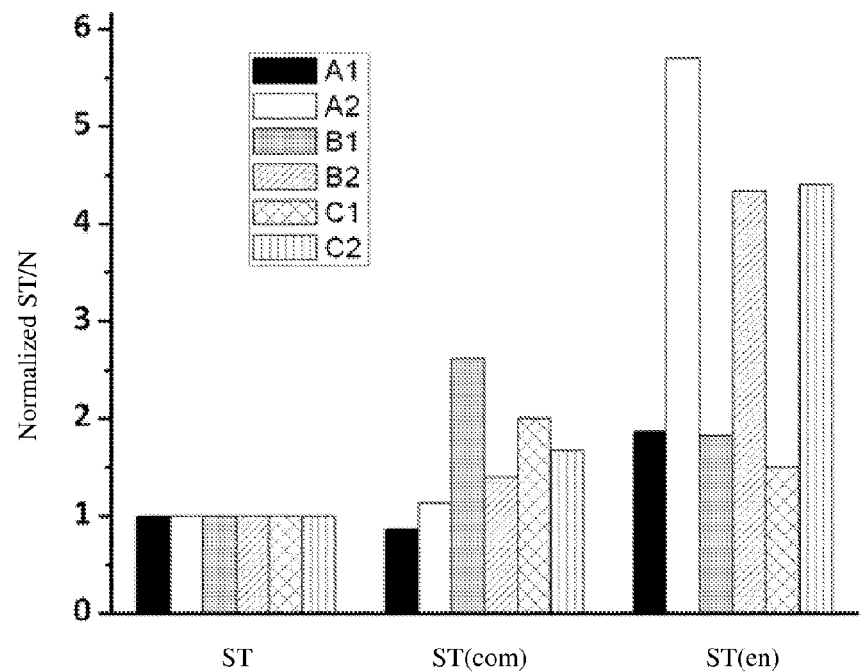

For example, FIG. 6B shows the (normalized) CNRs of the standard mode (ST), the complementary standard mode (ST (com)) and the enhanced standard mode (ST(en)). As may be seen, the CNR of the enhanced standard mode may always be higher than the one of the standard mode; particularly, the enhanced standard mode may be more advantageous when the CEST effect is high (as in the Z-spectra A2, B2 and C1). The CNR of the complementary standard mode is instead higher than the one of the standard mode in most of the Z-spectra, with the best performance in just the Z-spectra for which the enhanced mode worked less better than the standard one.

Figure 6C:
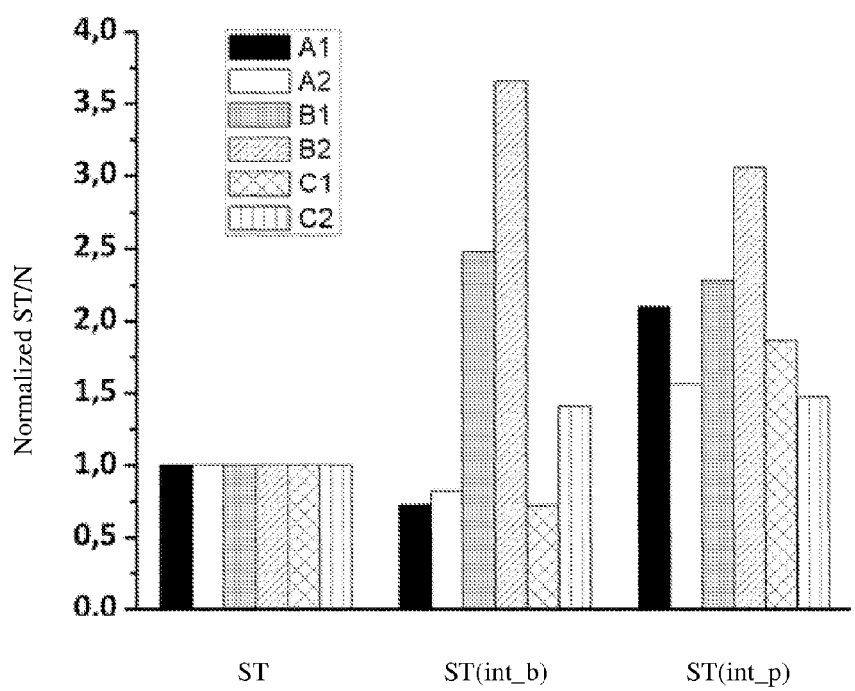

FIG. 6C shows the CNRs of the standard mode (ST), the integral bulk mode (ST(int_b)), and the integral peak mode (ST(int_p)). In general, the CNR of the integral (bulk and peak) modes is higher than the one of the standard mode, especially for the integral peak mode; particularly, both the integral modes may more advantageous when the CEST peak is broad (as in the Z-spectra B1 and B2)—whereas for narrow CEST peaks the integral peak mode provides better performance than the integral bulk mode.

Figure 6D:
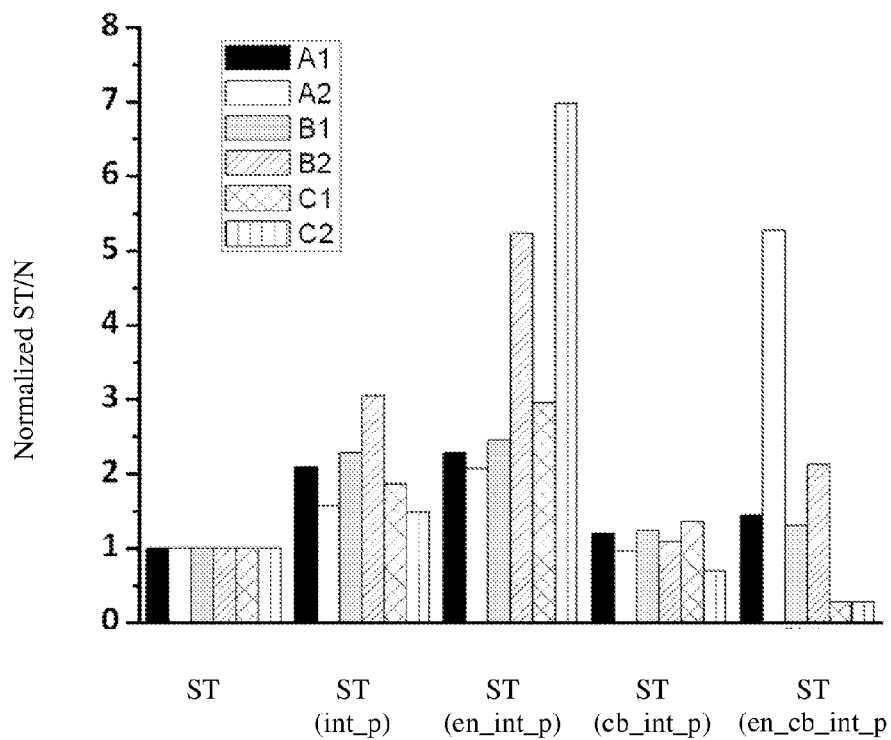

FIG. 6D shows the CNRs of the standard mode (ST), the integral peak mode (ST(int_p)), the enhanced integral peak mode (ST(en_int_p), the combined integral peak mode (ST (cb_int_p)), and the combined enhanced integral peak mode (ST(cb_en_int_p)). As may be seen, the CNR of the integral peak mode is higher than the one of the standard mode, and this difference is further emphasized in the enhanced integral peak mode; the combined integral peak mode, instead, is not particularly advantageous, with its performance that improves in the combined enhanced integral peak mode.

Figure 6E:
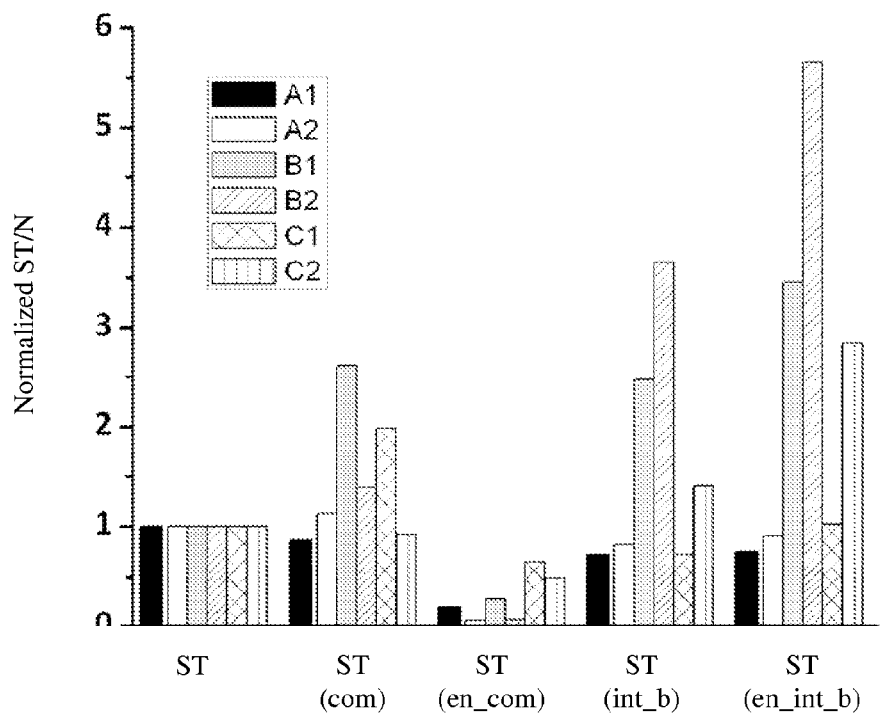

FIG. 6E shows the CNRs of the standard mode (ST), the complementary standard mode (ST(com)), the enhanced complementary standard mode (ST(en_com), the integral bulk mode (ST(int_b)), and the enhanced integral bulk mode (ST(en_int_b)). As above, the CNR of the complementary standard mode is mostly higher than the one of the standard mode, while its performance may be much worse in the enhanced complementary standard mode; likewise, the CNR of the integral bulk mode is generally higher than the one of the standard mode, with this difference that is further emphasized in the enhanced integral bulk mode.

Figure 6F:
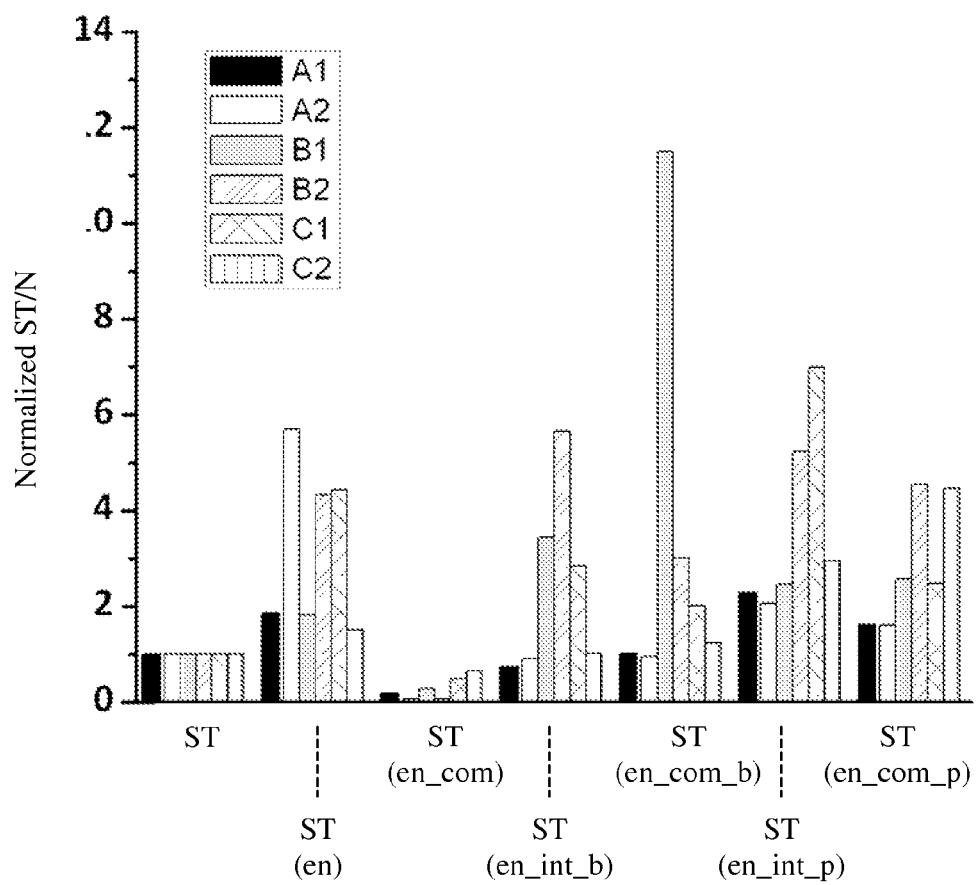

FIG. 6F shows the CNRs of the standard mode (ST), the enhanced standard mode (ST(en)), the enhanced complementary standard mode (ST(en_com), the enhanced integral bulk mode (ST(en_int_b)), the enhanced complementary bulk mode (ST(cb_en_int_b)), the enhanced integral peak mode (ST(en_int_p)), and the enhanced complementary peak mode (ST(cb_en_int_p)). As may be seen, the complementary modes may be particularly advantageous (like in the Z-spectra B1 and C2 and with the exception of the standard modes) when the enhanced modes do not provide the desired performance improvement.

Figure 7A:
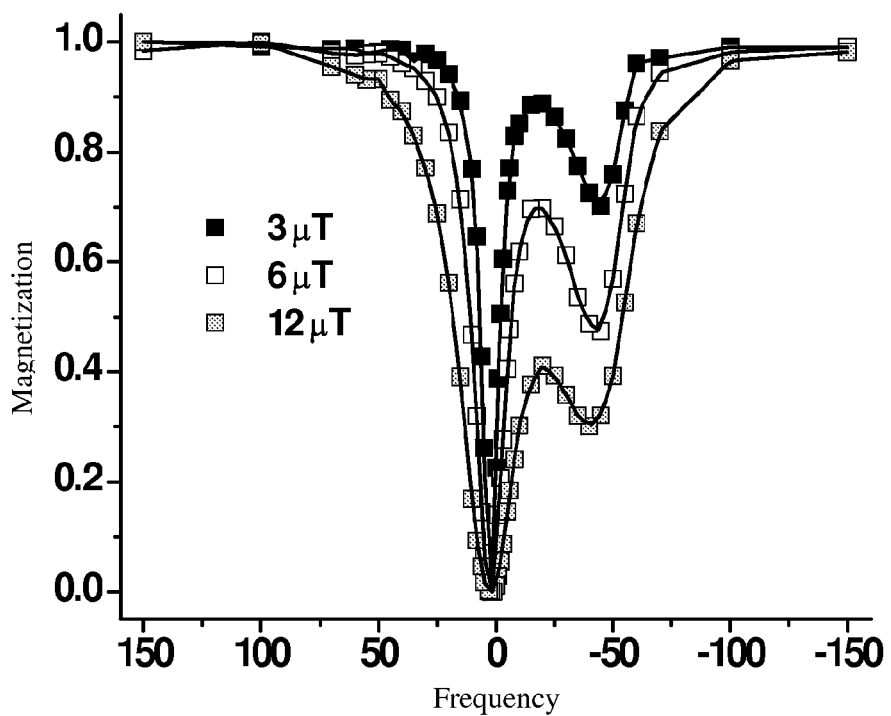
FIGS. 7A-7G show exemplary in vitro applications of different embodiments with corresponding comparisons thereof.
Figure 7B:
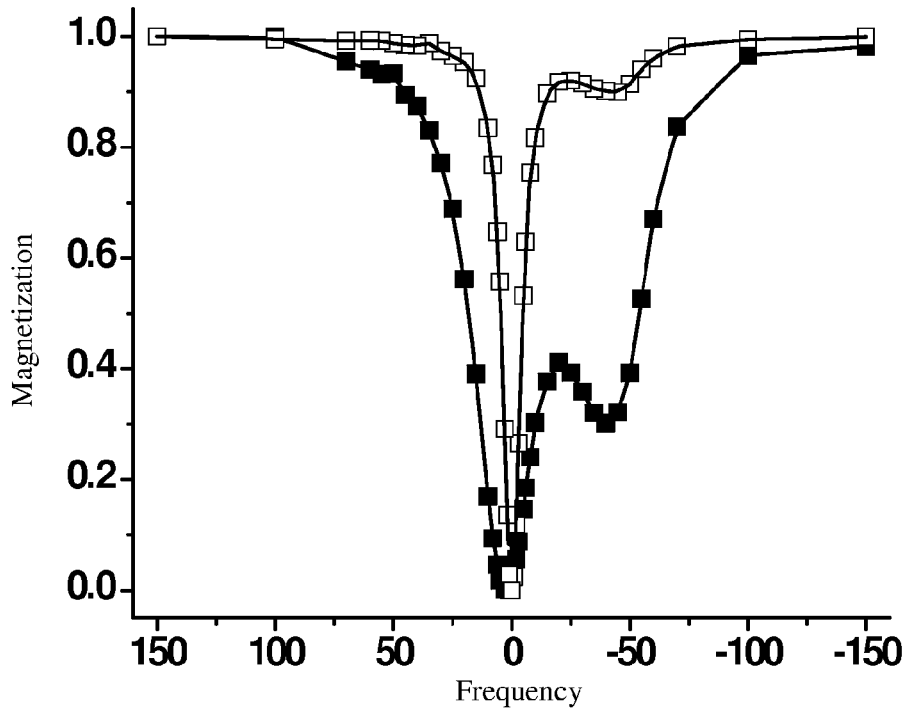

The different modes of operation were also tested in vitro on a phantom consisting of six capillaries filled up with different concentrations of an osmotically shrunken LIPOCEST agent (loaded with Dy(III)-based shift reagents), whose CEST offset was −45 ppm. Particularly, three Z-spectra at different intensities of the saturation pulses (i.e., 3 μT, 6 μT, and 12 μT) were acquired for the different concentrations of the CEST agent. FIG. 7A shows the Z-spectra at the different intensities of the saturation pulses for the highest concentration of the CEST agent, while FIG. 7B shows the Z-spectra at 12μT for the highest concentration of the CEST agent (in white) and for the lowest concentration of the CEST agent (in black).

As above, the performance of each mode of operation was expressed in terms of their CNR (normalized to the CNR of the standard mode); in this case, the CNR of each mode of operation was calculated as the ratio between the saturation transfer of the capillaries and the standard deviation of the saturation transfers in a region without the capillaries.

Figure 7C:
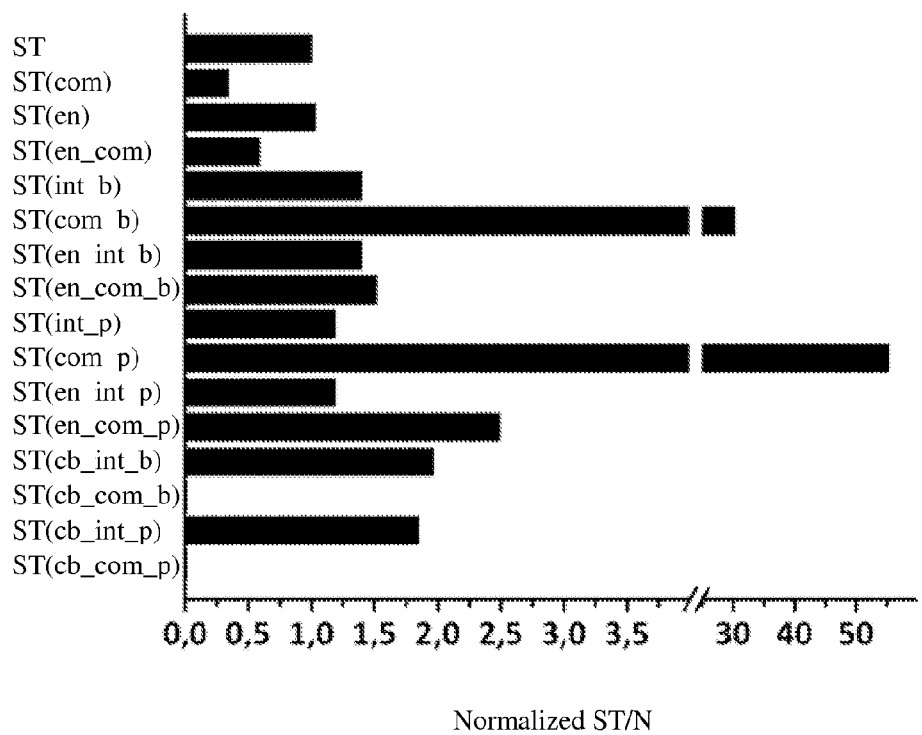

Particularly, FIG. 7C shows the CNRs—for the lowest concentration of the CEST agent—of the standard mode (ST), the complementary standard mode (ST(com)), the enhanced standard mode (ST(en)), the enhanced complementary standard mode (ST(en_com)), the integral bulk mode (ST(int_b)), the complementary bulk mode (ST(com_b)), the enhanced integral bulk mode (ST(en_int_b)), the enhanced complementary bulk mode (ST(en_com_b)), the integral peak mode (ST(int_p)), the complementary peak mode (ST(com_p)), the enhanced integral peak mode (ST(en_int_p)), the enhanced complementary peak mode (ST(en_com_p)), the combined integral bulk mode (ST(cb_int_b)), the combined complementary bulk mode (ST(cb_com_b)), the combined integral peak mode (ST(cb_int_p)), and the combined complementary peak mode (ST(cb_com_p)). As may be seen, the CNRs of most of the proposed modes are higher than the one of the standard mode (because of the broadness of the CEST peak); particularly, the best performance is provided by some of the complementary modes (because of the high magnetization at the CEST frequency).

Figure 7D:
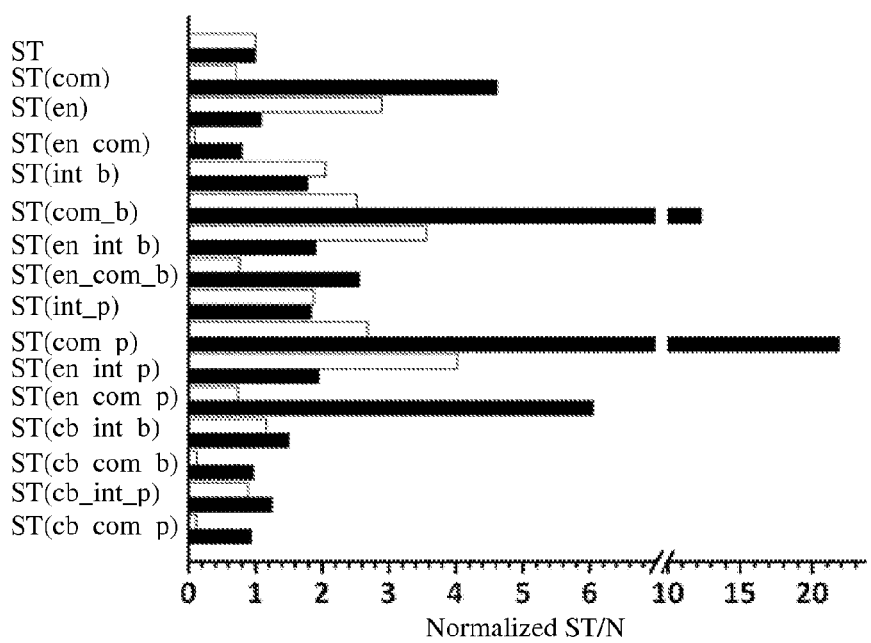

FIG. 7D shows the CNRs of the same modes as above for the highest concentration of the CEST agent (in white) and the lowest concentration of the CEST agent (in black). As may be seen, the performance of the complementary mode worsens at the highest concentration of the CEST agent (since the magnetization at the CEST frequency decreases).

Figure 7E:
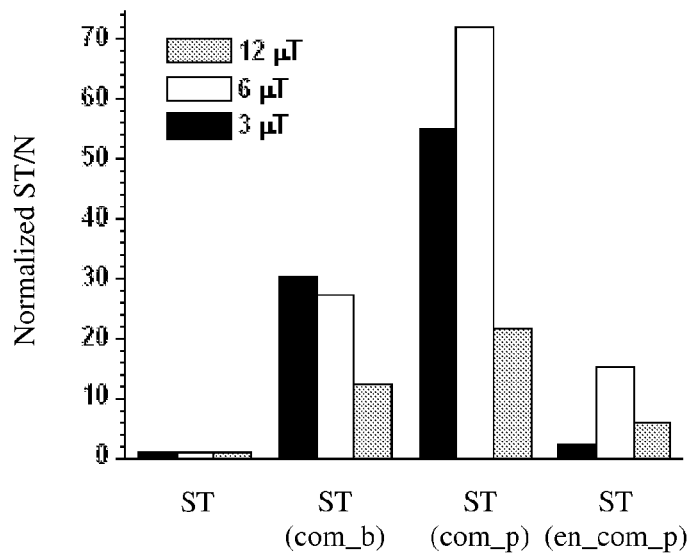

FIG. 7E shows the CNRs—for the lowest concentration of the CEST agent at 3 μT, 6 μT, and 12 μT—of the standard mode (ST), the complementary bulk mode (ST(com_b)), the complementary peak mode (ST(com_p)), and the enhanced complementary peak mode (ST(en_com_p)). As may be seen, the complementary modes are particularly advantages at low intensities of the saturation pulses (since the magnetization at the CEST frequency increases).

Figure 7F:
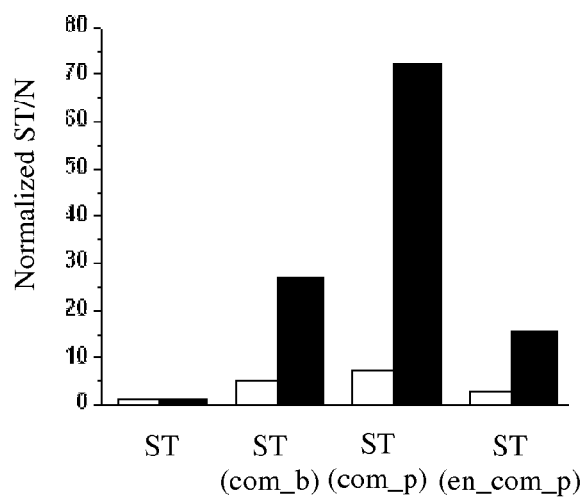

FIG. 7F shows the CNRs—at 6 μT—of the same modes as above for the highest concentration of the CEST agent (in white) and the lowest concentration of the CEST agent (in black). Again, the complementary modes may be particularly advantages at low concentrations of the CEST agent (since the magnetization at the CEST frequency likewise increases).

Figure 7G:
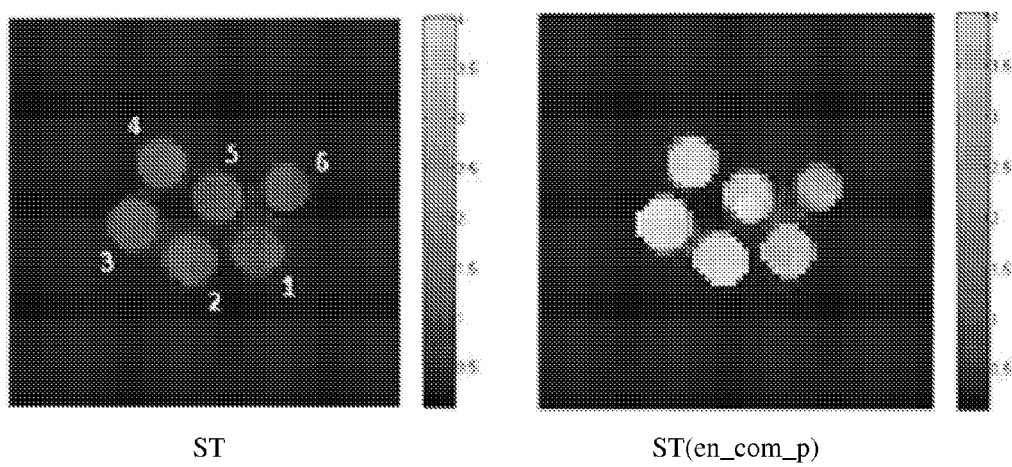

This may be more clearly evident in FIG. 7G, which shows the parametric images of the phantom that were obtained—at 6 μT for different concentrations of the CEST agent decreasing from the capillary denoted with 1 to the capillary denoted with 6—in the standard mode (ST) and in the enhanced complementary peak mode (ST(en_com_p)). As may be seen, the capillaries in the enhanced complementary peak mode are clearer than in the standard mode (i.e., the saturation transfer ST(en_com_p) is higher than the saturation transfer ST); moreover, the brightness of the capillaries in the enhanced complementary peak mode increases, as a consequence of an increase of the corresponding saturation transfer ST(en_com_p), as the concentration of the CEST agent decreases (from 1 to 6).

The same modes of operation were also tested on biological systems that were characterized by broad Z-spectra (ex vivo and in vivo).

Figure 8A:
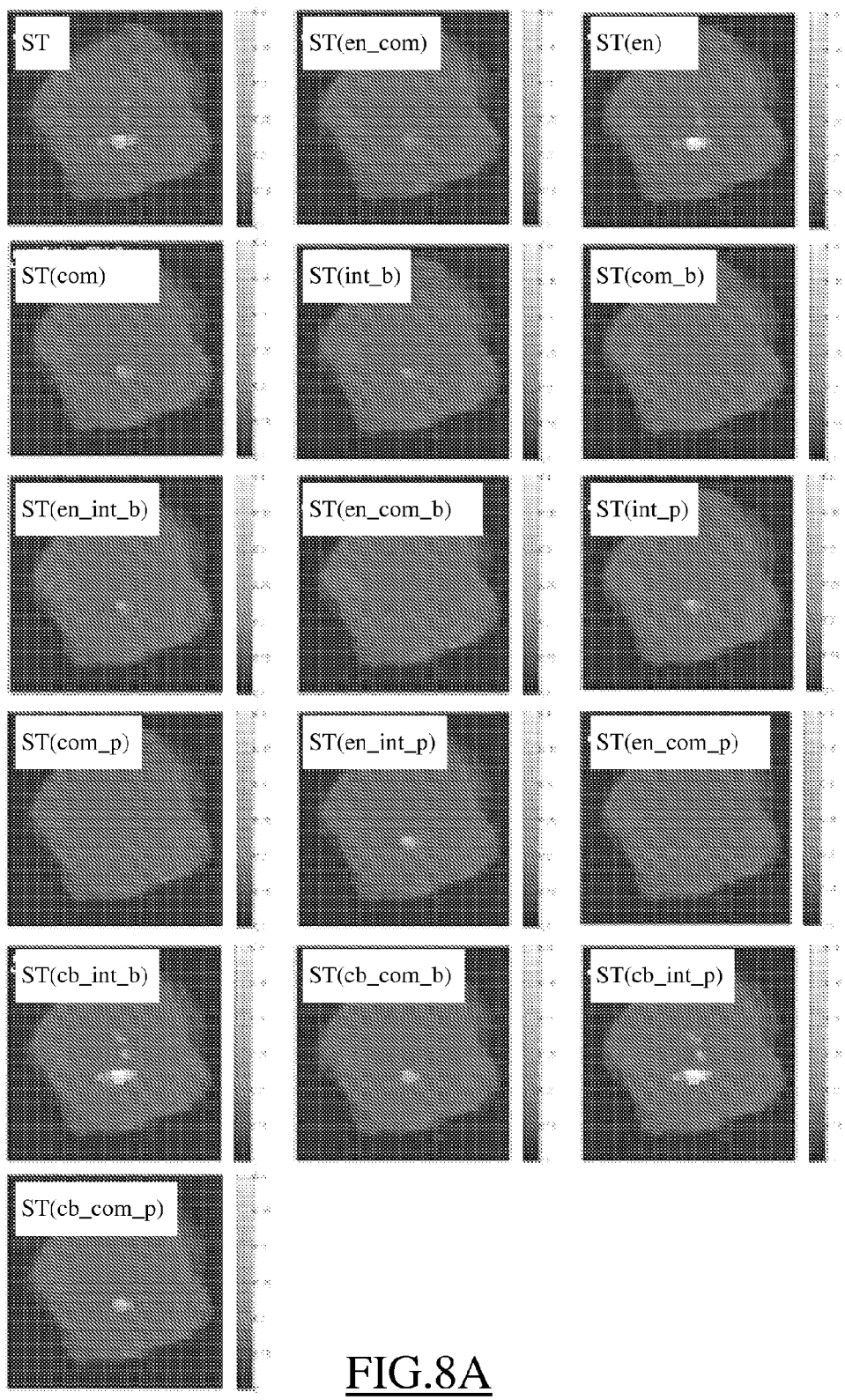
FIGS. 8A-8H show exemplary ex vivo and in vivo applications of different embodiments with corresponding comparisons thereof.

Particularly, an osmotically shrunken LIPOCEST agent (based on Tm-based shift reagents) with a CEST frequency of 18 ppm was injected into a bovine muscle (ex vivo). The corresponding parametric images—at 6 μT—are shown in FIG. 8A for the standard mode (ST), the enhanced complementary standard mode (ST(en_com)), the enhanced standard mode (ST(en)), the complementary standard mode (ST(com)), the integral bulk mode (ST(int_b)), the complementary bulk mode (ST(com_b)), the enhanced integral bulk mode (ST(en_int_b)), the enhanced complementary bulk mode (ST(en_com_b)), the integral peak mode (ST(int_p)), the complementary peak mode (ST(com_p)), the enhanced integral peak mode (ST(en_int_p)), the enhanced complementary peak mode (ST(en_com_p)), the combined integral bulk mode (ST(cb_int_b)), the combined complementary bulk mode (ST(cb_com_b)), the combined integral peak mode (ST(cb_int_p)), and the combined complementary peak mode (ST(cb_com_p)). As may be seen, the injection site may be clearly detectable in most of the modes of operation (including the standard one); however, the best performance may be provided by the enhanced standard mode, the combined integral bulk mode, and the combined integral peak mode.

Figure 8B:
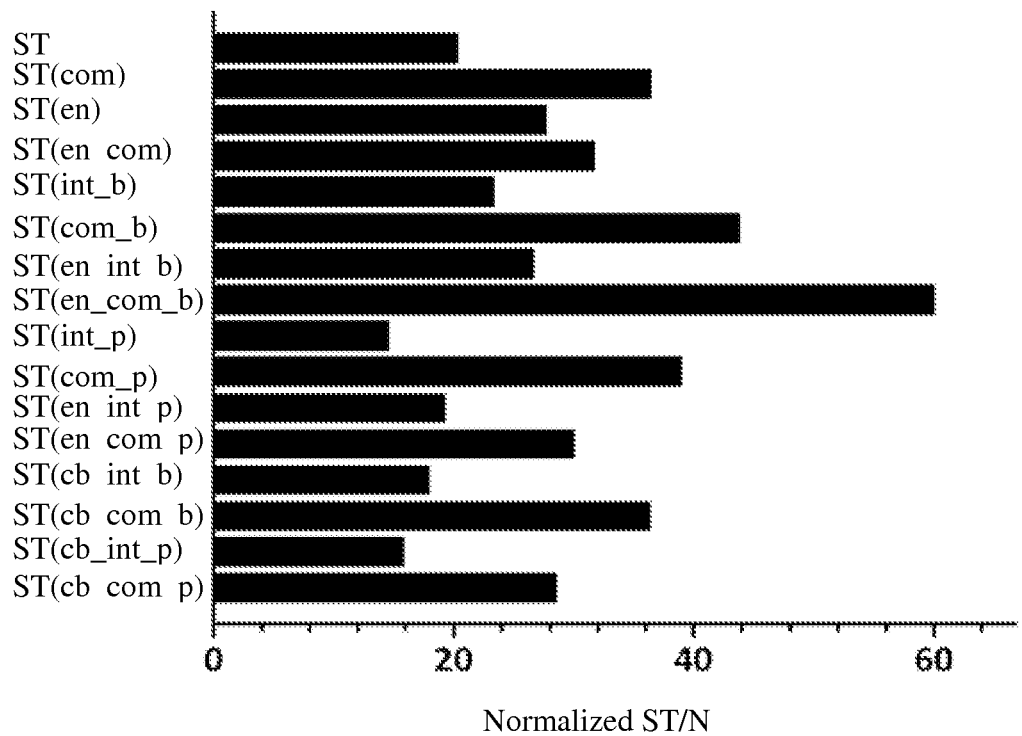

The same results are summarized in FIG. 8B, which shows the corresponding CNRs (again normalized to the CNR of the standard mode); in this case, the CNR of each mode of operation was calculated as the ratio between the saturation transfer of the injection site and the standard deviation of the saturation transfers in a region not containing the CEST agent.

Figure 8C:
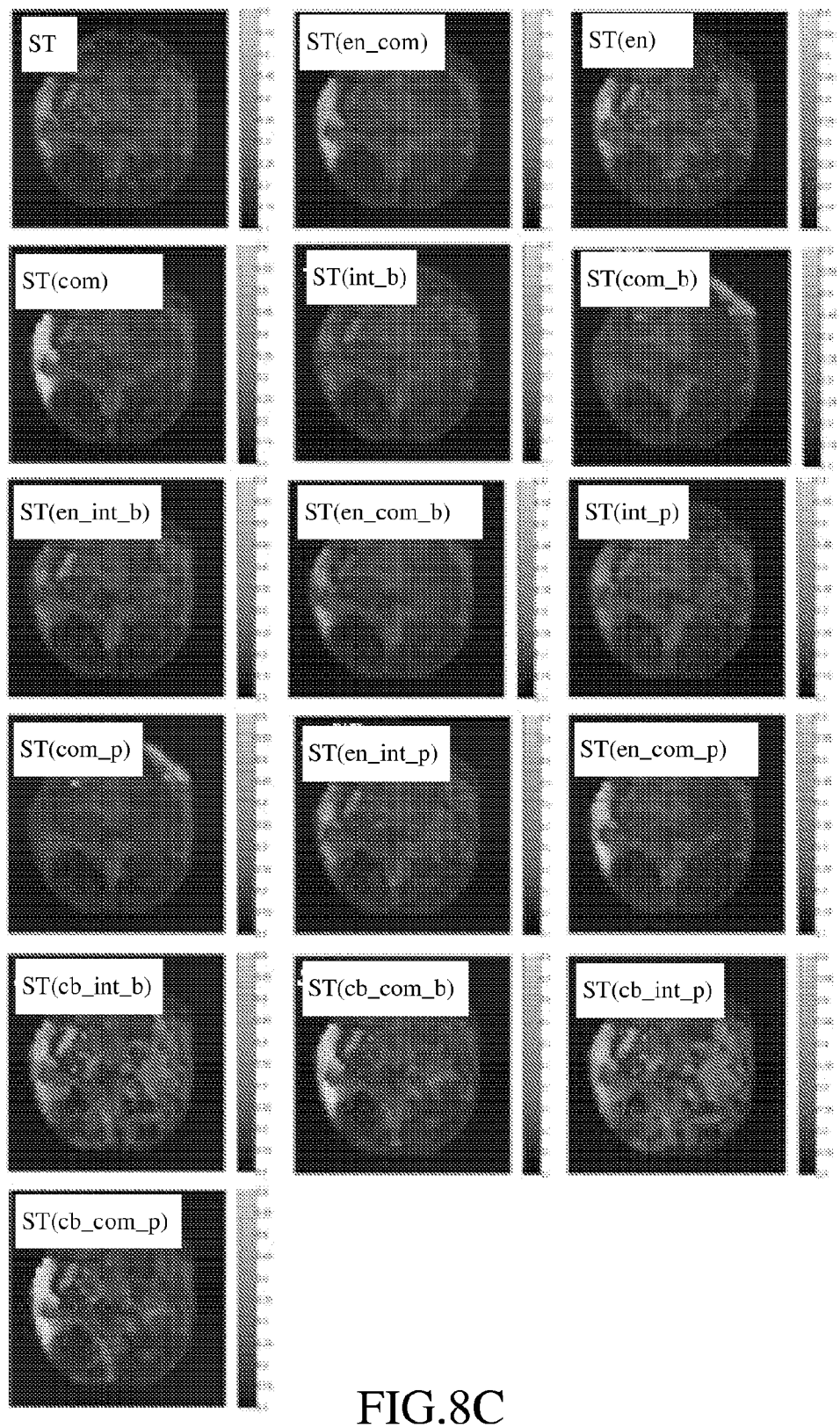

A Tm-based LIPOCEST agent with a CEST frequency of 7 ppm was then injected subcutaneously to a mouse flank (in vivo). The corresponding parametric images—at 6 μT—are shown in FIG. 8C for the same modes of operation as above. In this case, the best performance is provided by the complementary standard mode and the enhanced complementary peak mode.

Figure 8D:
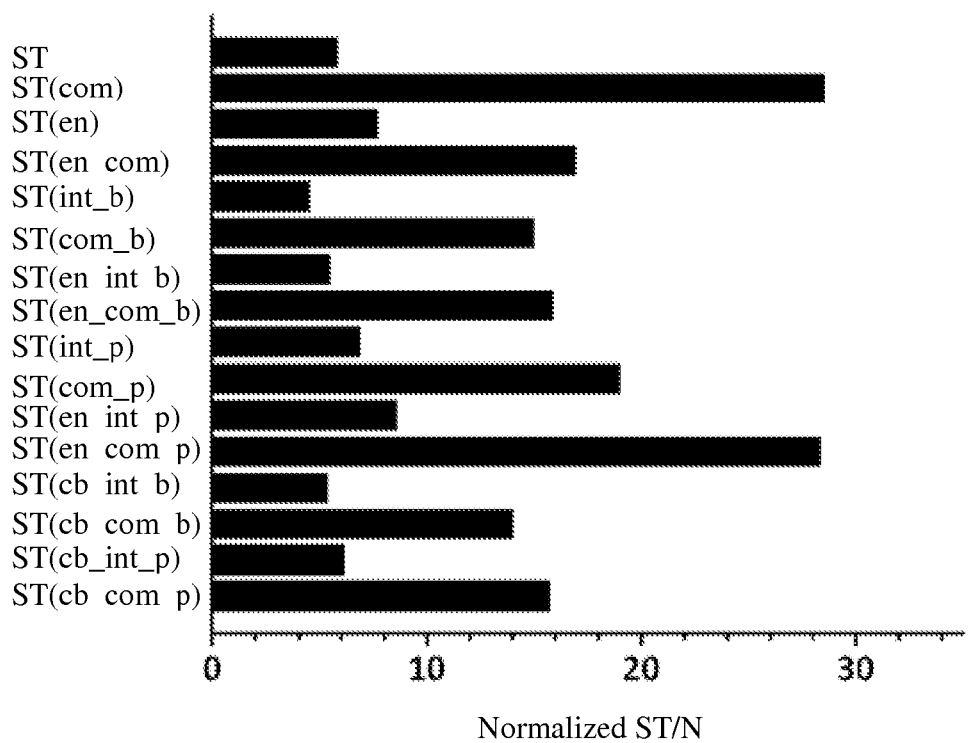

This is confirmed by the corresponding CNRs that are shown in FIG. 8D.

Figure 8E:
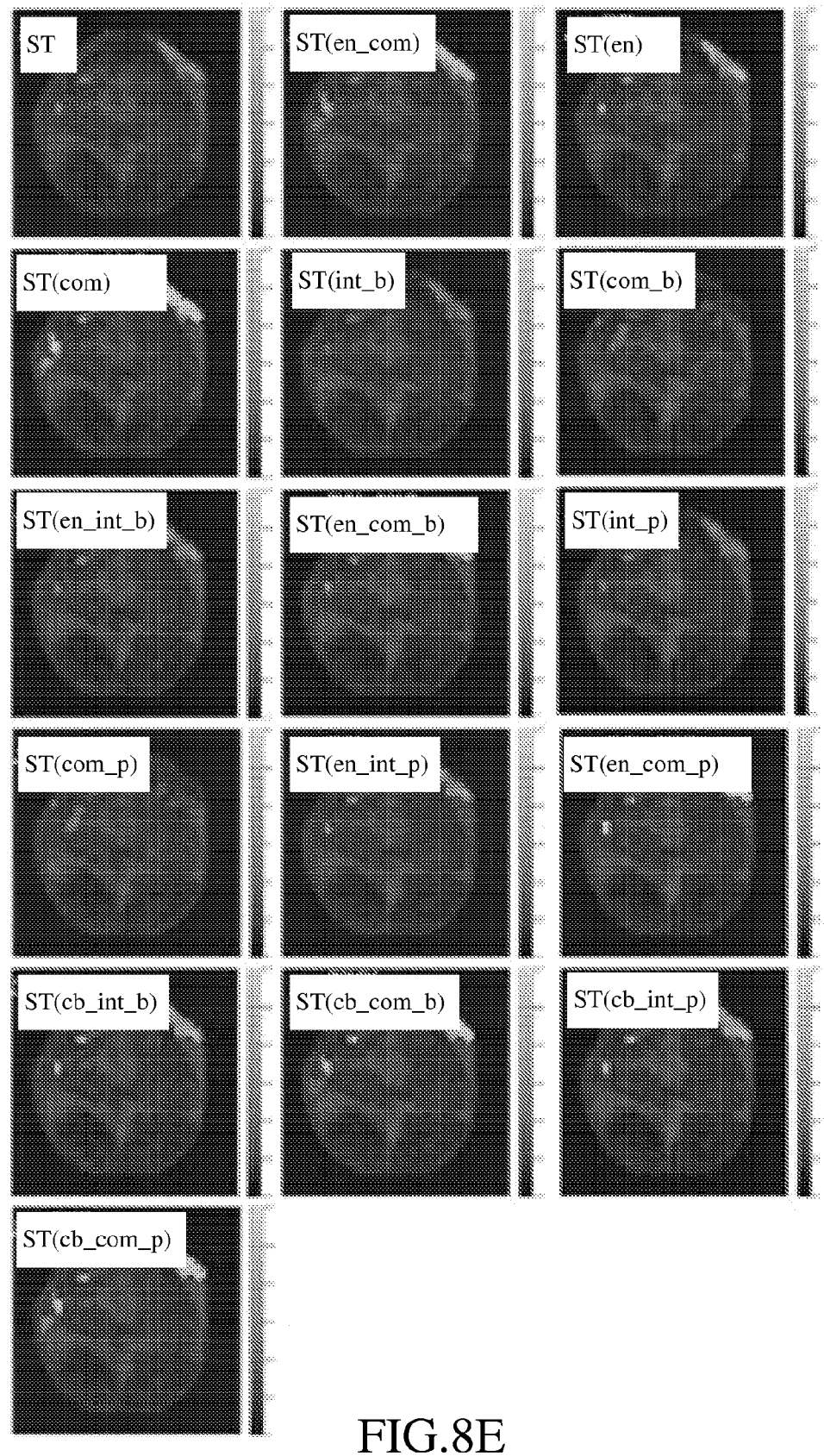

Moreover, a Dy-based LIPOCEST agent with a CEST frequency of −17 ppm was again injected subcutaneously to a mouse flank (in vivo). The corresponding parametric images—at 6 μT—are shown in FIG. 8E for the same modes of operation as above. In this case as well, the best performance may be provided by the complementary standard mode and the enhanced complementary peak mode.

Figure 8F:
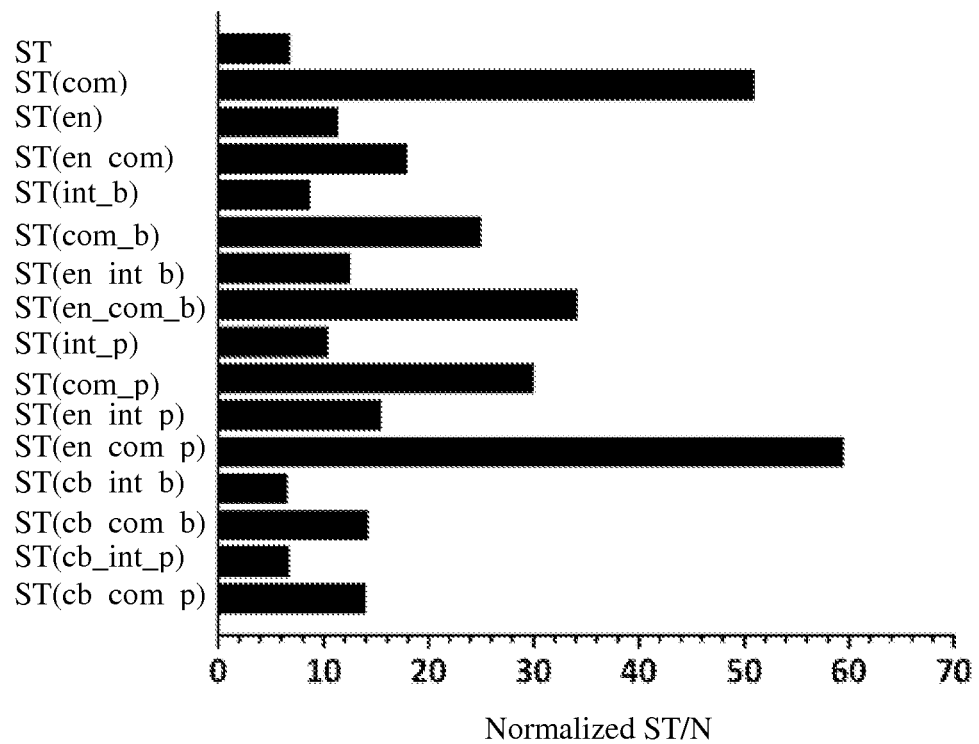

This is confirmed by the corresponding CNRs that are shown in FIG. 8F.

Figure 8G:
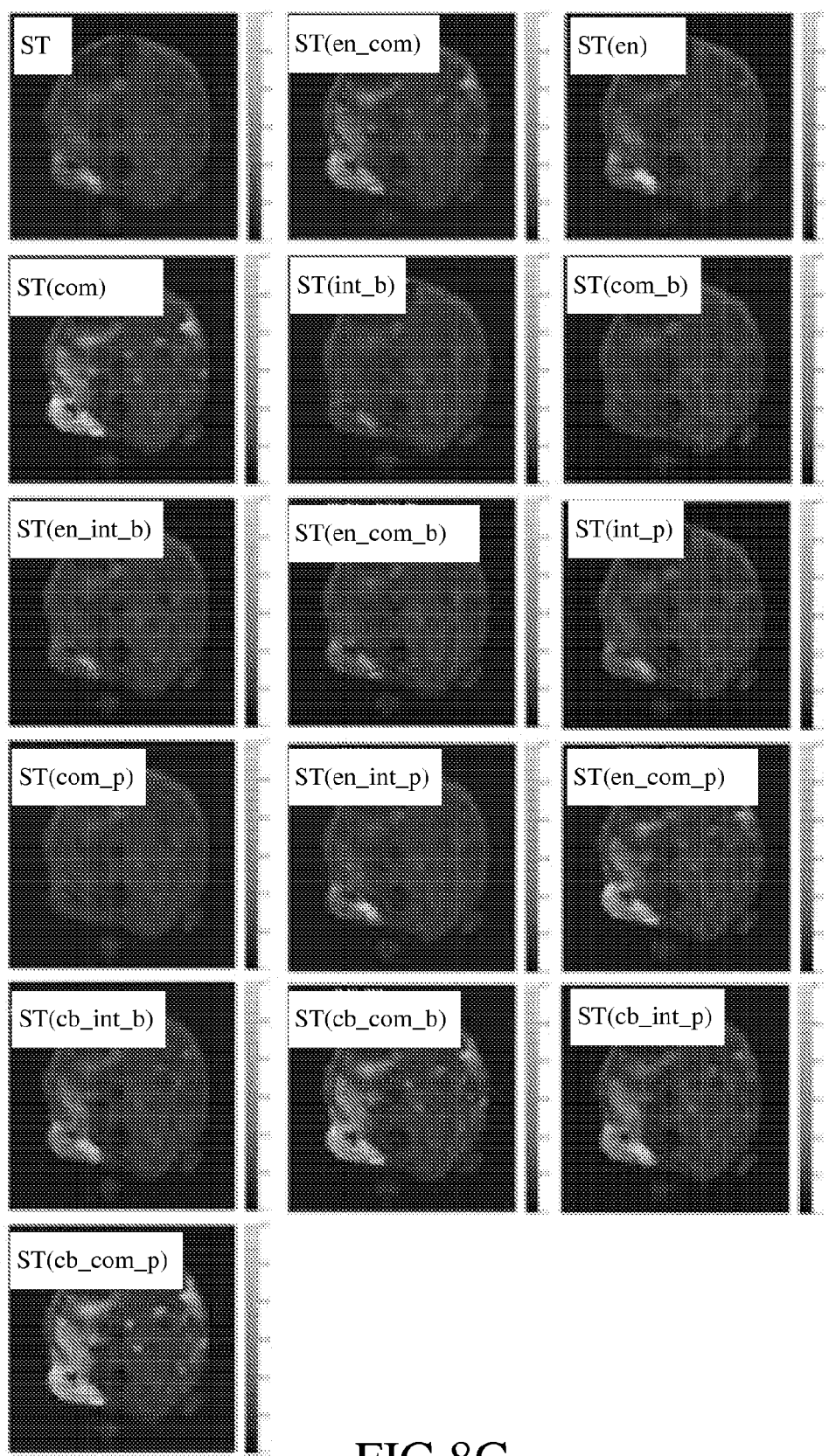
Figure 8H:
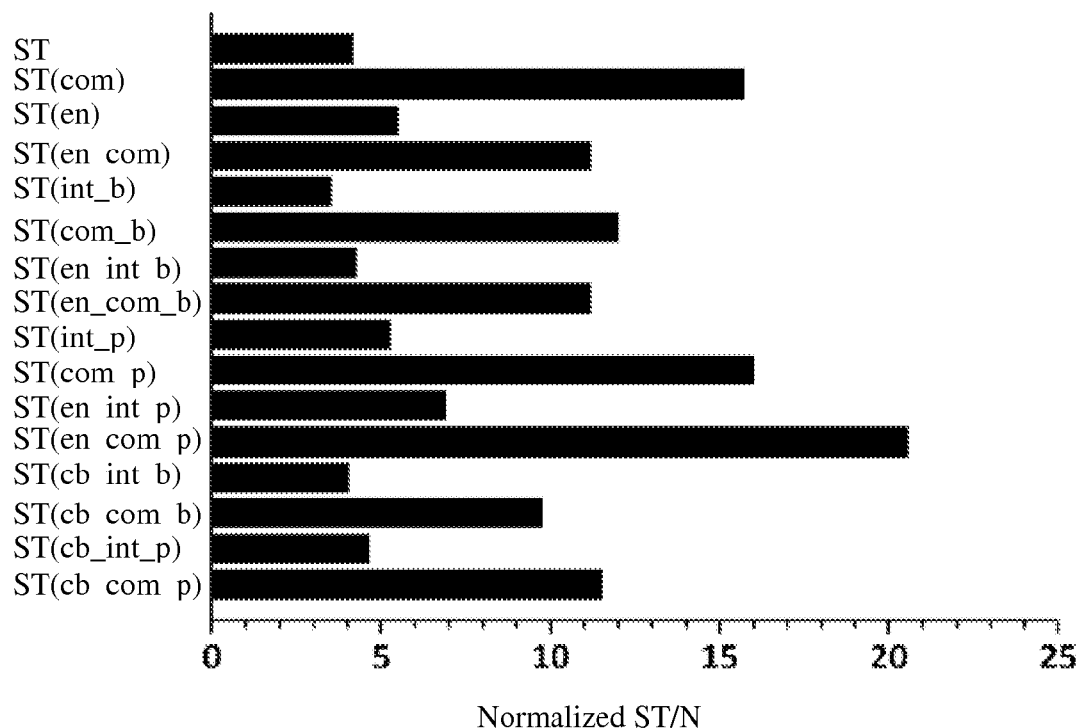

Likewise, a Tm-based LIPOCEST agent with a CEST frequency of 5 ppm was injected intratumorally to a mouse bearing a xenografted B16 melanoma (in vivo). Very similar results are provided by the corresponding parametric images (at 6 μT) shown in FIG. 8G, and by the corresponding CNRs shown in FIG. 8H.

The respective experimental protocols are explained in detail in the following.

Starting from the preparation of the CEST agents, osmotically shrunken LIPOCEST agents, encapsulating a hydrophilic lanthanide-based shift reagent (Ln-HPDO3A, in which Ln stays for lanthanide ion, and HPDO3A is a well known, commercially available, chelating agent) and incorporating an amphiphilic lanthanide-based shift reagent, hereinafter indicated as Ln-1, were prepared (as described, for instance, in "Terreno E, Cabella C, Carrera C, Delli Castelli D, Mazzon R, Rollet S, Stancanello J, Visigalli M, Aime S. From Spherical to Osmotically Shrunken Paramagnetic Liposomes: An Improved Generation of LIPOCEST MRI Agents with Highly Shifted Water Protons. Angew Chemie Int Ed, 2007, 46: 966-968"—the entire disclosure of which is herein incorporated by reference).

The formulation of the LIPOCEST agent used for the in vitro experiments was DPPC/DSPE-PEG2000/Dy-1 (75/5/20 in molar ratio, total amount of lipids: 20 mg), wherein DPPC=1,2-dipalmitoyl-sn-glycero-3-phosphocholine, and DSPE-PEG2000=1,2-distearoyl-sn-glycero-3-phosphoethanolamine-N-[methoxy(polyethylene glycol)-2000]. The concentration of the Dy-HPDO3A complex in the aqueous solution used for hydrating the lipidic film (volume 1 mL) was 10 mM. After the extrusion, the liposomes were dialyzed against an isotonic physiological buffer (pH 7.4, NaCl 0.15 M+HEPES 2.8 mM) in order to remove the compound being not encapsulated and induce the hyperosmotic stress necessary for changing the liposome shape. The liposome size was determined by Dynamic Light Scattering (Malvern NanoS Zetasizer) and resulted to be 158 nm (Polydispersity index, or PDI<0.1). The CEST offset was −45 ppm, as assessed by high-resolution NMR spectra carried out at 14T and 312K (Bruker Avance 600).

In vitro experiments were carried out on a phantom consisting of six capillaries filled with solutions at different concentrations of liposomes prepared by diluting the suspension with isotonic buffer (dilution factors 0, 1×, 2×, 4×, 8×, 16×). The concentration of liposomes in the suspension was roughly estimated by using the method described in "Terreno E, Delli Castelli D, Milone L, Rollet S, Stancanello J, Violante E, Aime S. First ex-vivo MRI co-localization of two LIPOCEST agents, Contr. Media Mol. Imaging, 2008, accepted for publication" (the entire disclosure of which is herein incorporated by reference), and resulted to be 44 nM.

For in vivo experiments, other three LIPOCEST agents were prepared. Two of them were osmotically shrunken LIPOCEST agents (Tm- and Dy-based) and one (Tm-based) was spherical. The membrane formulation of the osmotically shrunken vesicles was POPC/Cholesterol/DSPE-PEG2000/Ln-1 (50/15/5/30 in molar ratio, total amount of lipids 20 mg), wherein POPC=1-palmitoyl-2-oleyl-sn-glycero-3-phosphocholine. The concentration of the Ln-HPDO3A complexes in the aqueous solution used for hydrating the lipidic film (volume 1 mL) was 40 mM. The liposome size was 240 nm and 260 nm for Tm-based and the Dy-based LIPOCESTs, respectively (PDI<0.1). The CEST offset was 7 ppm and −15 ppm for the Tm-based and the Dy-based LIPOCEST agents, respectively. The experiments were performed by a subcutaneous injection of the two LIPOCEST probes (ca. 100 μL) into the flanks of a mouse. The formulation of the spherical LIPOCEST was DPPC/DSPE-PEG2000 (95/5 in molar ratio, total amount of lipids 60 mg). The concentration of Tm-DOTMA complex in the aqueous solution used for hydrating the lipidic film (volume 1 mL) was 200 mM. The liposome size was 91 nm (PDI<0.1). The CEST offset was 5 ppm.

Moving now to the acquisition of the Z-spectra, the scanner consisted of a Bruker Avance 300 spectrometer operating at 7T and equipped with a micro-imaging probe. Two different resonators (diameters of 10 mm and 30 mm used for in vitro and in vivo experiments, respectively) were used. Z-spectra were acquired in the working range of ±150 ppm using a Spin Echo RARE sequence (typical setting TR/TE/NEXIRARE factor=6000 ms/15 ms/1/8) preceded by a saturation pulse (single block pulse, duration 2 s) at two intensities (6 μT and 12 μT). A 64×64 sample map was used with a slice thickness of 2 mm and FOV values of 10×10 or 30×30 $mm^2$, depending on the resonator. MRI-CEST images were obtained using a standard Spin Echo pulse sequence (TR/TE/NEX=6000 ms/3 ms/1). All the in vivo acquisitions were performed using a standard fat-suppression module.

With reference to the image and data analysis, Z-spectra raw data was exported from the computer of the scanner and automatically elaborated by means of a home-written software running in MATLAB (The Mathworks, Inc., Natick, Mass., USA). The analysis consisted of several steps including image segmentation, global ROI analysis, and local voxel-by-voxel analysis. In particular, after an automatic image segmentation of the MRI image, a Region Of Interest (ROI) was manually selected. This identification aims at paying particular attention to some global features such as the water frequency and the saturation transfer inside the selected region (for example, investigation may be focused on tumor contrast uptake, blood vessels or edemas). To build Z-spectra, the magnetic response was sampled by using a 1 ppm sampling step for frequency offsets close to the water frequency. When investigating the saturation transfer at larger frequency offsets, the magnetic response showed smooth variations (except for noise), supporting the use of a lower sampling step. Z-spectra were interpolated by using smoothing splines. On the basis of the global analysis of the selected region of interest, the segmented image was locally investigated by calculating the saturation transfer at any desired frequency offset. Because the global analysis represents an average of the voxel-by-voxel behaviour, local effects may be masked when averaged over a large region of interest. This implies that global analysis could mask the presence of low, local CEST effects. For this reason, a local analysis, accounting for the different characteristics in each single voxel, was performed. Voxel-by-voxel analysis consisted of interpolating samples of response signals coming from each voxel of the segmented image in order to obtain the local Z-spectra. The approach followed for the local analysis is the same as for the global analysis—i.e., based on smoothing splines that take into account the low CNR of the voxel. This implies the use of a heavier smoothing factor (equal to 0.5) in the local analysis. The local analysis of the interpolated Z-spectra provides the zero map (i.e., the voxel-by-voxel distribution of the water frequency in the segmented image). The locally corrected analysis was carried out by shifting the interpolated Z-spectra of each voxel in order to fix the bulk water resonance to zero frequency offset. Then, a correct intra-voxel saturation transfer was calculated on the basis of the (shifted and interpolated) Z-spectra. In order to suppress residual noise, a 3-by-3 kernel median filter was applied to eliminate single noisy spikes.

Modifications

Naturally, in order to satisfy local and specific requirements, a person skilled in the art may apply to the solution described above many logical and/or physical modifications and alterations. More specifically, although one or more embodiments have been described with a certain degree of particularity, it should be understood that various omissions, substitutions and changes in the form and details as well as other embodiments are possible. Particularly, an embodiment may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment may be incorporated in any other embodiment as a matter of general design choice.

Particularly, similar considerations may apply if the scanner has a different structure or includes other units (for example, magnets providing the magnetic field at another intensity, alternative gradient and/or RF coils, and the like). An embodiment lends itself to be applied to the analysis of different body-parts (for example, organs, regions or tissues) for the detection of any other characteristics thereof (for example, the evolution of a pathological condition or the response to a treatment), to the analysis of animals or of any other object.

Moreover, the above-described CEST agents are merely illustrative and are not to be interpreted in a limitative manner, with the same technique that may be applied to one or more endogenous or exogenous CEST agents of whatever type (either alone or in combination); moreover, the (exogenous) CEST agent may be administered to the patient in any other way (even without any injection).

Alternatively, an embodiment is applied in a diagnostic system that consists of a scanner and a distinct computer (or any equivalent data processing system); in this case, the recorded information is transferred from the scanner to the computer for its processing (for example, through a digital, analog or network connection).

Similar considerations may apply if the input map has a different resolution, or if the saturation values are calculated for different groups of locations, for single locations, or even for a whole region of interest; in addition, nothing prevents applying an embodiment to 2-D locations (for corresponding pixels), at the level of the whole body-part or of a selected area thereof only. Moreover, the Z-spectra may be represented in another way; for example, the working frequency range may be different, the sample array of each cell may include another (lower or higher) number of magnetizations, even distributed differently throughout the working frequency range (for example, uniformly), the magnetizations may be measured in another way or they may be expressed in absolute terms (without any normalization), and so on.

The above-described examples of composite values (that may be used to calculate the saturation transfer) are not exhaustive; similar considerations may apply to the corresponding parametric values. For example, it is also possible to combine the composite values with the complements of the punctual values of the magnetization.

The above-described extension of the CEST frequency range and the reference frequency range (around the CEST frequency and the reference frequency, respectively) is merely illustrative; in any case, the possibility of starting the CEST frequency range and the reference frequency range exactly from the CEST frequency and the reference range, respectively, (either leftwards or rightwards) is not excluded.

The CEST and reference frequency ranges may also be wider (even reaching the other side of the Z-spectrum with respect to the water frequency).

Alternatively, the CEST frequency range and the reference frequency range may also be not symmetric around the CEST frequency and the reference frequency, respectively.

Even though in the preceding description reference has been made to the integrals for calculating the composite values, this is not to be interpreted in a limitative manner. For example, in alternative embodiments, each composite value is based on the sum of multiple values of the magnetization in the respective CEST or reference frequency range, on their average, or more generally on any other function thereof.

Moreover, the complement of the integrals may be calculated according to a different reference value (for example, consisting of the area of a rectangle extending over the corresponding CEST or reference frequency range with a height equal to the mean value of the magnetization); in this case as well, each composite value may also be based on the sum of multiple complemented values of the magnetization (with respect to their maximum value), on their average, or more generally on any other function thereof.

In any case, it may also be possible to calculate the saturation transfer according to any other comparison between the relevant composite values (for example, their simple ratio or difference).

Naturally, the saturation transfer may be expressed in a similar way (for example, as percentage values).

The saturation transfer may also be calculated with reference to other composite values (in addition to the above described water values or CEST values); for example, alternative saturation values may be defined as the difference between the CEST value and the reference value, divided by a further composite value being based on a different frequency range centered around the water frequency (for example, the integral or the complement of the integral of the Z-spectrum from +2/10 ppm to −2/10 ppm).

The possibility of combining the composite values and the punctual values with any other function is not excluded (for example, by dividing, summing or subtracting them).

Moreover, the combination between the composite values and the punctual values may be performed differently (for example, by first combining each composite value with the corresponding punctual value, and then combining together the values so obtained).

Nothing prevents estimating the central frequency of each Z-spectrum with alternative algorithms—for example, being based on more sophisticated computations taking into account a neighborhood of the theoretical water frequency (even if this feature is not strictly necessary, and it may be implemented globally at the level of the whole body-part or it may be omitted at all in simplified implementations of an embodiment).

Alternatively, the model function associated with each sample array may be determined with equivalent techniques—even without making any assumption about its nature (for example, by means of polynomial interpolations, neural networks, and the like).

The parametric images may be output in any way (for example, simply printed); moreover, they may be displayed without any (standard) MRI image in the background. In any case, the use of the obtained results for any other applications is contemplated (for example, only to calculate the saturation transfer of a selected ROI as a whole).

An embodiment lends itself to be put into practice with an equivalent method—by using similar steps, removing some steps being non-essential, or adding further optional steps; moreover, the steps may be performed in a different order, concurrently or in an interleaved way (at least in part).

An embodiment may be implemented as a plug-in for a pre-existing control program of the scanner, directly in the same control program, or as a stand-alone application (even running on a distinct computer or provided as a network service). Similar considerations may apply if the program (which may be used to implement each embodiment) is structured in a different way, or if additional modules or functions are provided; likewise, the memory structures may be of other types, or may be replaced with equivalent entities (not necessarily consisting of physical storage media). In any case, the program may take any form suitable to be used by any data processing system or in connection therewith (for example, within a virtual machine); particularly, the program may be in the form of external or resident software, firmware, or microcode (either in object code or in source code—for example, to be compiled or interpreted). Moreover, it may be possible to provide the program on any computer-usable medium; the medium may be any element suitable to contain, store, communicate, propagate, or transfer the program. For example, the medium may be of the electronic, magnetic, optical, electromagnetic, infrared, or semiconductor type; examples of such medium are fixed disks (where the program may be pre-loaded), removable disks, tapes, cards, wires, fibers, wireless connections, networks, electromagnetic waves, and the like. In any case, an embodiment lends itself to be implemented even with a hardware structure (for example, integrated in a chip of semiconductor material), or with a combination of software and hardware.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An MRI-CEST diagnostic system, comprising:
an input module configured to provide an input map including a plurality of input elements each one for a corresponding selected location of a body-part, each input element being indicative of a spectrum of a magnetic response of the corresponding selected location including the magnetic response at an agent frequency of resonance of a CEST agent providing a magnetization transfer with a bulk substrate of the body-part, the agent frequency being at an agent offset of frequency from a bulk frequency of resonance of the bulk substrate, and at a reference frequency at the opposite of the agent offset from the bulk frequency,
a calculation module configured to calculate an agent value and a reference value for each one of a set of the selected locations, the agent value being calculated according to multiple magnetic responses of the selected location in a non-punctual agent range of frequencies centered around the agent frequency, and the reference value being calculated according to multiple magnetic responses of the selected location in a non-punctual reference range of frequencies centered around the reference frequency, the reference range being symmetric to the agent range with respect to the bulk frequency, and
a comparator module configured to calculate a parametric value for each one of the set of selected locations, the parametric value being calculated according to a comparison between the agent value and the reference value of the selected location.

2. The system according to claim 1, wherein the agent range and the reference range extend around the bulk frequency from a first agent limit to a second agent limit being different from the agent frequency, and from a first reference limit to a second reference limit being different from the reference frequency, respectively.

3. The system according to claim 2, wherein the first agent limit and the first reference limit consist of the bulk frequency.

4. The system according to claim 1,
wherein the calculation module includes an integrator module configured to calculate the agent value according to an integral of the magnetic responses of the selected location in the agent range, and to calculate the reference value according to an integral of the magnetic responses of the selected location in the reference range.

5. The system according to claim 1,
wherein the calculation module includes a complement module configured to calculate the agent value according to a complement of an integral of the magnetic responses of the selected location in the agent range, and to calculate the reference value according to a complement of an integral of the magnetic responses of the selected location in the reference range.

6. The system according to claim 1, wherein the calculation module includes a module configured to calculate the parametric value according to an intermediate value, the intermediate value being based on a first ratio between the reference value and the agent value.

7. The system according to claim 6, wherein the calculation module includes a module configured to set the parametric value to one minus the intermediate value.

8. The system according to claim 6, wherein the calculation module includes a module configured to set the intermediate value to the first ratio.

9. The system according to claim 6, wherein the calculation module includes a module configured to calculate the intermediate value according to a combination of the first ratio with a second ratio between the magnetic response of the selected location at the reference frequency and the magnetic response of the selected location at the agent frequency.

10. The system according to claim 9, wherein the calculation module includes a module configured to set the intermediate value to a product between the first ratio and the second ratio.

11. The system according to claim 1, wherein the input module includes:
an estimation module configured to estimate a central frequency for each selected location, the central frequency providing a minimum value of the magnetic response of the selected location, and
a correction module configured to set the bulk frequency of each selected location to the central frequency of the selected location.

12. The system according to claim 11, wherein each input element includes a sample array of a plurality of magnetic responses of the corresponding location in a working range of frequencies including the bulk frequency, the agent frequency and the reference frequency, the estimation module including:
an associating module configured to associate a model function with the sample array of each selected location, and
a setting module configured to set the central frequency for each selected location to a minimum of the corresponding model function.

13. The system according to claim 1, further including:
a module configured to create a parametric image by assigning the corresponding parametric value to each selected location, and
a display module configured to display the parametric image.

14. A method, comprising the steps of:
with a diagnostic system, providing an input map including a plurality of input elements each one for a corresponding selected location of a body-part, each input element being indicative of a spectrum of a magnetic response of the corresponding selected location including the magnetic response at an agent frequency of resonance of a CEST agent providing a magnetization transfer with a bulk substrate of the body-part, the agent frequency being at an agent offset of frequency from a bulk frequency of resonance of the bulk substrate, and at a reference frequency at the opposite of the agent offset from the bulk frequency,
with the diagnostic system, calculating an agent value and a reference value for each one of a set of the selected locations, the agent value being calculated according to multiple magnetic responses of the selected location in a non-punctual agent range of frequencies centered around the agent frequency, and the reference value being calculated according to multiple magnetic responses of the selected location in a non-punctual reference range of frequencies centered around the reference frequency, the reference range being symmetric to the agent range with respect to the bulk frequency, and
with a diagnostic system, calculating a parametric value for each one of the set of selected locations, the parametric value being calculated according to a comparison between the agent value and the reference value of the selected location.

15. A method, comprising the steps of:
with a diagnostic system, providing an input map including a plurality of input elements each one for a corresponding selected location of a body-part, each input element being indicative of a spectrum of a magnetic response of the location including the magnetic response at an agent frequency of resonance of a CEST agent providing a magnetization transfer with a bulk substrate of the body-part, the agent frequency being at an agent offset of frequency from a bulk frequency of resonance of the bulk substrate, and at a reference frequency at the opposite of the agent offset from the bulk frequency,
with the diagnostic system, calculating an agent value and a reference value for each one of a set of the selected locations, the agent value being calculated according to multiple magnetic responses of the selected location in a non-punctual agent range of frequencies centered around the agent frequency, and the reference value being calculated according to multiple magnetic responses of the selected location in a non-punctual reference range of frequencies centered around the reference frequency, the reference range being symmetric to the agent range with respect to the bulk frequency, and
with the diagnostic system, calculating a parametric value for each one of the set of the selected locations, the parametric value being calculated according to a comparison between the agent value and the reference value of the selected location.

16. The method according to claim 15, further comprising:
administering the CEST agent to the body-part, and
wherein the step of providing an input map includes acquiring the input map from the body-part.

17. The method according to claim 15, further including the step of:
inferring characteristics of each one of the set of the selected locations according to the corresponding parametric value.

18. A computer program product including a non-transitory computer-usable medium embodying a computer program, the computer program when executed on a data processing system causing the system to perform a method, including the steps of:
providing an input map including a plurality of input elements each one for a corresponding selected location of a body-part, each input element being indicative of a spectrum of a magnetic response of the corresponding selected location including the magnetic response at an agent frequency of resonance of a CEST agent providing a magnetization transfer with a bulk substrate of the body-part, the agent frequency being at an agent offset of frequency from a bulk frequency of resonance of the bulk substrate, and at a reference frequency at the opposite of the agent offset from the bulk frequency,
calculating an agent value and a reference value for each one of a set of the selected locations, the agent value being calculated according to multiple magnetic responses of the selected location in a non-punctual agent range of frequencies centered around the agent frequency, and the reference value being calculated according to multiple magnetic responses of the selected location in a non-punctual reference range of frequencies centered around the reference frequency, the reference range being symmetric to the agent range with respect to the bulk frequency, and
calculating a parametric value for each one of the set of the selected locations, the parametric value being calculated according to a comparison between the agent value and the reference value of the selected location.

19. A computer program product including a non-transitory computer-usable medium embodying a computer program, the computer program when executed on a data processing system causing the system to perform a method, including the steps of:
providing an input map including a plurality of input elements each one for a corresponding selected location of a body-part, each input element being indicative of a spectrum of a magnetic response of the corresponding selected location including the magnetic response at an agent frequency of resonance of a CEST agent providing a magnetization transfer with a bulk substrate of the body-part, the agent frequency being at an agent offset of frequency from a bulk frequency of resonance of the bulk substrate, and at a reference frequency at the opposite of the agent offset from the bulk frequency,
calculating an agent value and a reference value for each one of a set of the selected locations, the agent value being calculated according to multiple magnetic responses of the selected location in a non-punctual agent range of frequencies centered around the agent frequency, and the reference value being calculated according to multiple magnetic responses of the selected location in a non-punctual reference range of frequencies centered around the reference frequency, the reference range being symmetric to the agent range with respect to the bulk frequency, and
calculating a parametric value for each one of the set of the selected locations, the parametric value being calculated according to a comparison between the agent value and the reference value of the selected location.

* * * * *